(12) United States Patent
Lin et al.

(10) Patent No.: US 10,622,424 B2
(45) Date of Patent: Apr. 14, 2020

(54) PIXEL CIRCUIT AND DRIVING METHOD THEREOF, DISPLAY PANEL

(71) Applicant: BOE TECHNOLOGY GROUP CO., LTD., Beijing (CN)

(72) Inventors: Yi-Cheng Lin, Beijing (CN); Quanhu Li, Beijing (CN); Yu Wang, Beijing (CN); Cuili Gai, Beijing (CN); Mingi Chu, Beijing (CN); Chien Pang Huang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 32 days.

(21) Appl. No.: 15/780,454

(22) PCT Filed: Nov. 24, 2017

(86) PCT No.: PCT/CN2017/112907
§ 371 (c)(1),
(2) Date: May 31, 2018

(87) PCT Pub. No.: WO2018/205556
PCT Pub. Date: Nov. 15, 2018

(65) Prior Publication Data
US 2019/0280066 A1 Sep. 12, 2019

(30) Foreign Application Priority Data
May 12, 2017 (CN) .......................... 2017 1 0333212

(51) Int. Cl.
*H01L 27/32* (2006.01)
*G09G 3/3225* (2016.01)
(Continued)

(52) U.S. Cl.
CPC ............ *H01L 27/3248* (2013.01); *G09G 3/00* (2013.01); *G09G 3/3208* (2013.01); *G09G 3/3225* (2013.01); *H01L 27/3225* (2013.01)

(58) Field of Classification Search
CPC ............ H01L 27/3248; H01L 27/3225; G09G 3/3225
See application file for complete search history.

(56) References Cited

U.S. PATENT DOCUMENTS 8,982,017 B2 * 3/2015 Lee ....................... G09G 3/3225
345/76
9,013,373 B2 * 4/2015 Takasugi .............. G09G 3/3233
345/76
(Continued)

FOREIGN PATENT DOCUMENTS

CN 103325341 A 3/2013
CN 103700345 A 4/2014
(Continued)

OTHER PUBLICATIONS

First Chinese Office Action dated Nov. 1, 2019.

*Primary Examiner* — Vinh T Lam
(74) *Attorney, Agent, or Firm* — Dilworth & Barrese, LLP.; Michael J. Musella, Esq.

(57) ABSTRACT

A pixel circuit and a driving method thereof, and a display panel is provided. The pixel circuit includes a first selection circuit, a first driving circuit, a first capacitor, a first sensing circuit, a first organic light emitting element, a second capacitor and a capacitor control circuit. The first selection circuit and the first capacitor are electrically connected, and are configured to control the first driving circuit; the first sensing circuit is electrically connected to the first driving circuit and the first organic light emitting element and is configured to sense the first driving circuit or the first organic light emitting element; and the capacitor control (Continued)

circuit is configured to allow the first capacitor and the second capacitor to be connected in parallel or to be disconnected.

20 Claims, 16 Drawing Sheets

(51) Int. Cl.
*G09G 3/3208* (2016.01)
*G09G 3/00* (2006.01)

(56) References Cited

U.S. PATENT DOCUMENTS

| | | | | |
|---|---|---|---|---|
| 9,047,814 | B2* | 6/2015 | Toyomura | G09G 3/3225 |
| 9,105,213 | B2* | 8/2015 | Kwak | G09G 1/005 |
| 9,285,938 | B2* | 3/2016 | Zhou | G06F 3/0412 |
| 9,626,035 | B2 | 4/2017 | Tan et al. | |
| 9,911,799 | B2* | 3/2018 | Cho | H01L 27/326 |
| 9,946,375 | B2* | 4/2018 | Akhavan Fomani | G06F 3/041 |
| 9,984,272 | B2* | 5/2018 | Yang | G09G 3/32 |
| 10,224,494 | B2* | 3/2019 | Watabe | H01L 51/0085 |
| 10,229,939 | B2* | 3/2019 | Takahashi | H01L 27/1225 |
| 2014/0176520 | A1* | 6/2014 | Hwang | G09G 3/003 345/211 |
| 2015/0053947 | A1* | 2/2015 | Qing | G09G 3/3233 257/40 |
| 2015/0108437 | A1* | 4/2015 | Cho | H01L 27/3248 257/40 |
| 2015/0109189 | A1* | 4/2015 | Hwang | G09G 3/3225 345/78 |
| 2015/0154899 | A1* | 6/2015 | Chang | G09G 3/3233 345/76 |
| 2015/0161940 | A1* | 6/2015 | Woo | G09G 3/003 345/58 |
| 2015/0179105 | A1 | 6/2015 | Mizukoshi | |
| 2015/0187273 | A1* | 7/2015 | Chang | G09G 3/3233 345/690 |
| 2015/0221255 | A1* | 8/2015 | Qing | G06F 3/0412 345/173 |
| 2015/0302793 | A1* | 10/2015 | In | G09G 3/3208 345/211 |
| 2015/0325171 | A1* | 11/2015 | Zhou | G09G 3/3233 345/80 |
| 2015/0378470 | A1* | 12/2015 | Yang | G06F 3/044 345/174 |
| 2016/0012798 | A1* | 1/2016 | Oh | G09G 3/325 345/205 |
| 2016/0041676 | A1* | 2/2016 | Tan | G06F 3/0416 345/173 |
| 2016/0062522 | A1* | 3/2016 | Yang | G06F 3/0412 345/174 |
| 2016/0086535 | A1* | 3/2016 | Kimura | G09G 3/3225 345/690 |
| 2016/0103513 | A1* | 4/2016 | Yang | G06F 3/041 345/175 |
| 2016/0104419 | A1* | 4/2016 | Chung | G09G 3/3225 345/78 |
| 2016/0155379 | A1* | 6/2016 | Na | G09G 3/3233 345/215 |
| 2016/0203759 | A1* | 7/2016 | Han | G09G 3/3233 345/212 |
| 2016/0225313 | A1* | 8/2016 | Qing | G09G 3/3233 |
| 2016/0246422 | A1 | 8/2016 | Tan et al. | |
| 2016/0260380 | A1* | 9/2016 | Yang | G09G 3/32 |
| 2016/0267844 | A1* | 9/2016 | Senda | G09G 3/2018 |
| 2016/0307497 | A1* | 10/2016 | Nie | G09G 3/3233 |
| 2017/0103706 | A1* | 4/2017 | Yang | G06F 3/0416 |
| 2017/0116925 | A1* | 4/2017 | Lee | G09G 3/3225 |

FOREIGN PATENT DOCUMENTS

| | | |
|---|---|---|
| CN | 104240644 A | 12/2014 |
| CN | 104392691 A | 3/2015 |
| CN | 104732920 A | 6/2015 |
| CN | 106205479 A | 12/2016 |

* cited by examiner

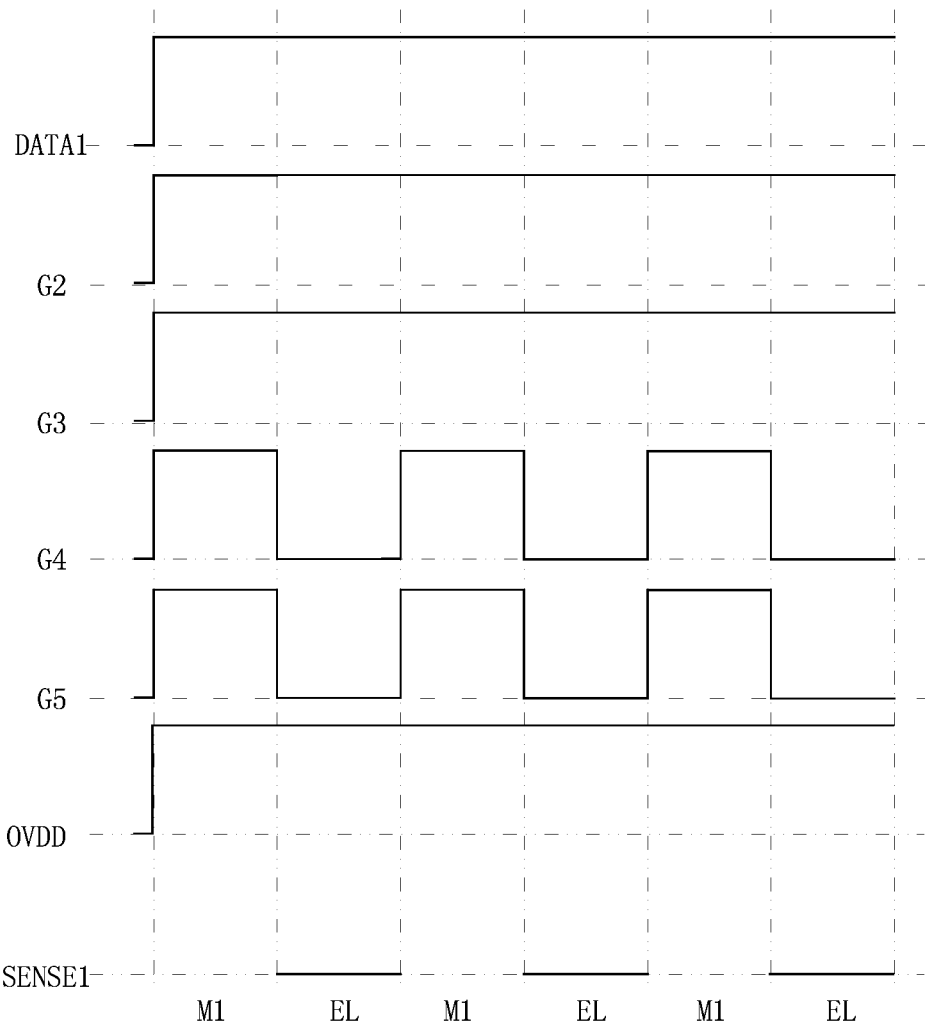

S210 — in a first monitoring stage, allowing the capacitor control circuit to connect the first capacitor and the second capacitor in parallel, and allowing the first sensing circuit to monitor the first driver circuit or the first organic light emitting element S220 — in a second monitoring stage, allowing the capacitor control circuit to connect the first capacitor and the second capacitor in parallel, and allowing the first sensing circuit to monitor the second driver circuit or the second organic light emitting element S230 — in a light-emitting stage, allowing the capacitor control circuit to disconnect the first capacitor from the second capacitor, and allowing the driver circuit to drive the first organic light emitting element and/or the second organic light emitting element to work

Fig.12A

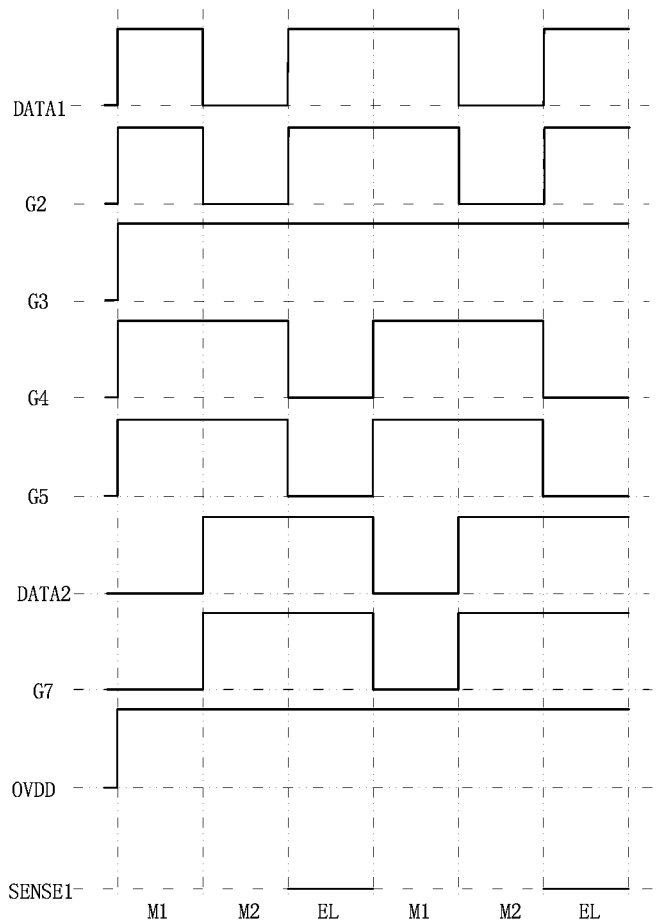

Fig.12B

PIXEL CIRCUIT AND DRIVING METHOD THEREOF, DISPLAY PANEL

TECHNICAL FIELD

Embodiments of the present disclosure relate to a pixel circuit and a driving method thereof, and a display panel.

BACKGROUND

Organic light emitting diode (OLED) display devices have been gradually attracted the attention of people due to wide viewing angle, high contrast, fast response, and advantages such as higher luminance, lower driving voltage and the like over inorganic light emitting diode display devices.

For organic light-emitting diode display devices, in order to allow the displayed images insusceptible to the effect of component aging, external compensation is generally required. By detecting the current flowing through a thin film transistor or an organic light-emitting diode, the aging degree of the thin film transistor or the organic light-emitting diode can be determined, such that corrected values of corresponding data signals can be calculated.

SUMMARY

An embodiment of present application provides a pixel circuit, which comprises a first selection circuit, a first driving circuit, a first capacitor, a first sensing circuit, a first organic light emitting element, a second capacitor and a capacitor control circuit. The first selection circuit and the first capacitor are electrically connected with each other, and are configured to control the first driving circuit; the first driving circuit is electrically connected to the first organic light emitting element, and is configured to drive the first organic light emitting element; the first sensing circuit is electrically connected to the first driving circuit and the first organic light emitting element and is configured to sense the first driving circuit or the first organic light emitting element; and the capacitor control circuit is configured to allow the first capacitor and the second capacitor to be connected in parallel or to be disconnected.

For example, in the pixel circuit provided by an embodiment of present application, the first capacitor is electrically connected to the first sensing circuit.

For example, in the pixel circuit provided by an embodiment of present application, the pixel circuit further comprises a second selection circuit, a second driving circuit and a second organic light emitting element. The second selection circuit and the second capacitor are configured to control the second driving circuit, and the second driving circuit is electrically connected to the second organic light emitting element and is configured to drive the second organic light emitting element.

For example, in the pixel circuit provided by an embodiment of present application, the pixel circuit further comprises a second sensing circuit. The second sensing circuit is electrically connected to the second driving circuit and the second organic light emitting element, and is configured to sense the second driving circuit or the second organic light emitting element.

For example, in the pixel circuit provided by an embodiment of present application, the pixel circuit further comprises a first control circuit and a second control circuit. The first control circuit is configured to control whether or not the first driving circuit is electrically connected to a first power source terminal, and the second control circuit is configured to control whether or not the second driving circuit is electrically connected to the first power source terminal.

For example, in the pixel circuit provided by an embodiment of present application, the pixel circuit further comprises a first node and a second node. The first driving circuit comprises a first transistor, the first selection circuit comprises a second transistor, the first sensing circuit comprises a third transistor, the capacitor control circuit comprises a fourth transistor, a first terminal of the first transistor is configured to be electrically connected to the first power source terminal, the second terminal of the first transistor is electrically connected to the first node, the control terminal of the first transistor is electrically connected to the second node; a first terminal of the second transistor is configured to be electrically connected to a first data line, a second terminal of the second transistor is electrically connected to the second node; a first terminal of the third transistor is electrically connected to the first node, a second terminal of the third transistor is configured to be electrically connected to a first monitoring line; a first terminal of the fourth transistor is electrically connected to the second node, a second terminal of the fourth transistor of is electrically connected to a first terminal of the second capacitor, a second terminal of the second capacitor is electrically connected to the first node; a first terminal of the first capacitor is electrically connected to the first node, a second terminal of the first capacitor is electrically connected to the second node; and a first terminal of the first organic light emitting element is electrically connected to the first node, a second terminal of the first organic light emitting element is configured to be electrically connected to a second power source terminal.

For example, in the pixel circuit provided by an embodiment of present application, the pixel circuit further comprises a first node and a second node. The first driving circuit comprises a first transistor, the first selection circuit comprises a second transistor, the first sensing circuit comprises a third transistor, the capacitor control circuit comprises a fourth transistor and a fifth transistor, a first terminal of the first transistor is configured to be electrically connected to the first power source terminal, the second terminal of the first transistor is electrically connected to the first node, the control terminal of the first transistor is electrically connected to the second node; a first terminal of the second transistor is configured to be electrically connected to a first data line, a second terminal of the second transistor is electrically connected to the second node; a first terminal of the third transistor is electrically connected to the first node, a second terminal of the third transistor is configured to be electrically connected to a first monitoring line; a first terminal of the fourth transistor is electrically connected to the second node, a second terminal of the fourth transistor of is electrically connected to a first terminal of the second capacitor; a first terminal of the fifth transistor is electrically connected to the first node, a second terminal of the fifth transistor is electrically connected to a second terminal of the second capacitor; a first terminal of the first capacitor is electrically connected to the first node, a second terminal of the first capacitor is electrically connected to the second node; and a first terminal of the first organic light emitting element is electrically connected to the first node, a second terminal of the first organic light emitting element is configured to be electrically connected to a second power source terminal.

For example, in the pixel circuit provided by an embodiment of present application, the pixel circuit further comprises a third node and a fourth node. The second driving circuit comprises a sixth transistor, the second selection circuit comprises a seventh transistor, a first terminal of the sixth transistor is configured to be electrically connected to the first power source terminal, a second terminal of the sixth transistor is electrically connected to the third node, a control terminal of the sixth transistor is electrically connected to the fourth node; a first terminal of the seventh transistor is configured to be electrically connected to a second data line, a second terminal of the seventh transistor is electrically connected to the fourth node; the first terminal of the second capacitor is electrically connected to the fourth node, the second terminal of the second capacitor is electrically connected to the third node; a first terminal of the second organic light emitting element is electrically connected to the third node, a second terminal of the second organic light emitting element is configured to be electrically connected to the second power source terminal.

For example, in the pixel circuit provided by an embodiment of present application, the second sensing circuit comprises an eighth transistor, a first terminal of the eighth transistor is electrically connected to the third node, and a second terminal of the eighth transistor is configured to be electrically connected to a second monitoring line.

For example, in the pixel circuit provided by an embodiment of present application, the first control circuit comprises a ninth transistor. The second control circuit comprises a tenth transistor; a first terminal of the ninth transistor is electrically connected to the first terminal of the first transistor, a second terminal of the ninth transistor is configured to be electrically connected to the first power source terminal; and a first terminal of the tenth transistor is electrically connected to the first terminal of the sixth transistor, a second terminal of the tenth transistor is configured to be electrically connected to the first power source terminal.

For example, in the pixel circuit provided by an embodiment of present application, a control terminal of the fourth transistor and a control terminal of the fifth transistor are configured to be electrically connected to same one signal line.

For example, in the pixel circuit provided by an embodiment of present application, the second power source terminal is a GND terminal.

For example, in the pixel circuit provided by an embodiment of present application, light emitted by the first organic light emitting element and light emitted by the second organic light emitting element are different in color.

Another embodiment of present application provides a display panel, which comprises the above-mentioned pixel circuit.

Further another embodiment of present application provides a driving method for the pixel circuit, the driving method for the pixel circuit comprises: in a first monitoring stage, allowing the capacitor control circuit to connect the first capacitor and the second capacitor in parallel, and allowing the first sensing circuit to monitor the first driving circuit or the first organic light emitting element.

For example, the driving method provided by further another embodiment of present application further comprises: in a light-emitting stage, allowing the capacitor control circuit to disconnect the first capacitor from the second capacitor, and allowing the first driving circuit to drive the first organic light emitting element to work For example, in the driving method provided by further another embodiment of present application, the pixel circuit further comprises a second selection circuit, a second driving circuit and a second organic light emitting element, the second selection circuit and the second capacitor are configured to control the second driving circuit, the second driving circuit is electrically connected to the second organic light emitting element and is configured to drive the second organic light emitting element; the driving method further comprising: in a second monitoring stage, allowing the capacitor control circuit to connect the first capacitor and the second capacitor in parallel, and allowing the first sensing circuit to monitor the second driving circuit or the second organic light emitting element.

BRIEF DESCRIPTION OF THE DRAWINGS

In order to clearly illustrate the technical solution of the embodiments of the disclosure, the drawings used in the description of the embodiments or relevant technologies will be briefly described in the following; it is obvious that the described drawings are only related to some embodiments of the disclosure and thus are not limitative of the disclosure.

FIG. 11A is a schematic flow chart of a driving method of a pixel circuit provided by further another embodiment of present disclosure;

FIG. 11B is a schematic timing diagram of the driving method as illustrated in FIG. 11A;

FIG. 12A is a schematic flow chart of another driving method of a pixel circuit provided by further another embodiment of present disclosure;

FIG. 12B is a schematic timing diagram of the driving method as illustrated in FIG. 12A;

DETAILED DESCRIPTION

Figure 1A:
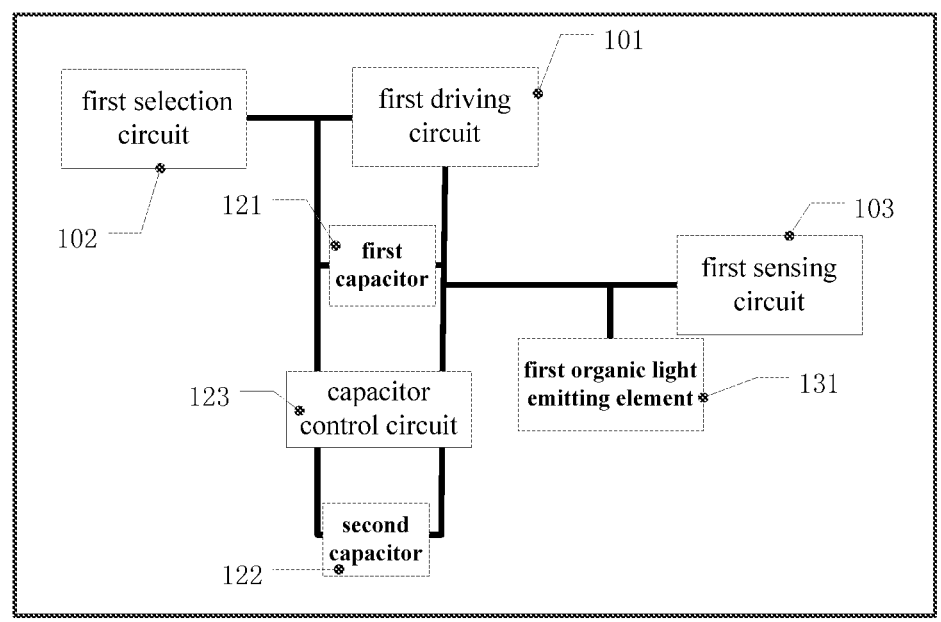
FIG. 1A is a schematic block diagram of a pixel circuit provided by an embodiment of present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Embodiments of present disclosure provide a pixel circuit and a driving method thereof, and a display panel, which accelerates the charging speed in a sensing stage, and increases the accuracy of the sensed value, and thus improves the compensation effect of the pixel circuit; therefore, the luminous uniformity of the display panel is increased, and the display effect thereof is improved.

At least one embodiment of present application provides a pixel circuit, which comprises a first selection circuit, a first driving circuit, a first capacitor, a first sensing circuit, a first organic light emitting element, a second capacitor and a capacitor control circuit. The first selection circuit and the first capacitor are configured to control the first driving circuit; the first driving circuit is electrically connected to the first organic light emitting element, and is configured to drive the first organic light emitting element; the first sensing circuit is electrically connected to the first driving circuit and the first organic light emitting element and is configured to sense the first driving circuit or the first organic light emitting element; and the capacitor control circuit is configured to allow the first capacitor and the second capacitor to be connected in parallel or to be disconnected.

For example, FIG. 1A is a schematic block diagram of a pixel circuit provided by an embodiment of present disclosure, as illustrated in FIG. 1A, the pixel circuit can comprise a first selection circuit 102, a first driving circuit 101, a first capacitor 121, a first sensing circuit 103, a first organic light emitting element 131, a second capacitor 122 and a capacitor control circuit 123. For example, concrete structures of the first selection circuit 102, the first driving circuit 101, the first capacitor 121, the first sensing circuit 103, the first organic light emitting element 131, the second capacitor 122 and the capacitor control circuit 123 can be set according to specific implementation demands, and no specific limitations are given in the present disclosure in this aspect. For example, the pixel circuit provided by an embodiment of present disclosure can be implemented as the circuit diagram as illustrated in FIG. 1B.

Figure 1B:
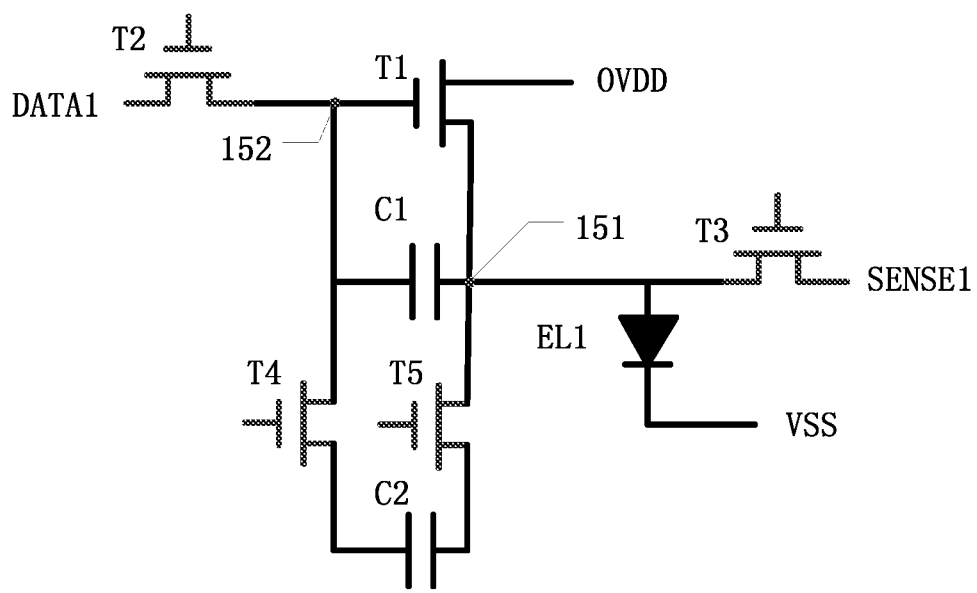
FIG. 1B is a schematic circuit diagram of the pixel circuit as illustrated in FIG. 1A.

For example, as illustrated in FIG. 1A and FIG. 1B, the first driving circuit 101 is electrically connected to the first organic light emitting element 131 (for example, the element EL1 illustrated in FIG. 1B), and is configured to drive the first organic light emitting element 131. For example, the first driving circuit 101 can comprise a first transistor T1, the first transistor T1 can comprise a first terminal, a second terminal and a control terminal, and the first terminal and the second terminal can be electrically connected with each other in the case that a turn-on signal (for example, a signal with a high voltage level) is received by the control terminal. For example, the pixel circuit further comprises a first node 151 and a second node 152, a first terminal of the first transistor T1 can be configured to be electrically connected to a first power source terminal OVDD, a second terminal of the first transistor T1 can be electrically connected to the first node 151, and the control terminal of the first transistor T1 can be electrically connected to the second node 152. For example, the first power source terminal OVDD can be a voltage source so as to outputs a positive voltage with constant value, and can also be a current source.

For example, as illustrated in FIG. 1A and FIG. 1B, a first terminal of the first organic light emitting element 131 can be electrically connected to the first node 151, and a second terminal of the first organic light emitting element 131 can be configured to be electrically connected to a second power source terminal VSS. For example, the first organic light emitting element 131 can be an organic light emitting diode; the second power source terminal VSS can be a GND terminal. For example, in the case that the control terminal of the first transistor T1 receives a turn-on signal, an electrical signal (for example, a current signal) originated from the first power source terminal OVDD can drive the first organic light emitting element 131 (for example, the element EL1 illustrated in FIG. 1B) to emit light.

For example, as illustrated in FIG. 1A and FIG. 1B, the first selection circuit 102 and the first capacitor 121 (for example, the element C1 illustrated in FIG. 1B) can be configured to control the first driving circuit 101. For example, the first selection circuit 102 can comprise a second transistor T2; a first terminal of the second transistor T2 can be configured to be electrically connected to a first data line DATA1, and a second terminal of the second transistor T2 can be electrically connected to the second node 152. For example, in the case that a control terminal of the second transistor T2 receives a turn-on signal, an electrical signal originated from the first data line DATA1 is transmitted to the control terminal of the first transistor T1 via the second transistor T2, and then stored in the first capacitor C1 so as to change the voltage of the second node 152, such that the first transistor T1 can be in a turn-on value when required at a later time so as to drive the first organic light emitting element EL1. For example, a first terminal of the first capacitor 121 can be electrically connected to the first node 151, and a second terminal of the first capacitor 121 can be electrically connected to the second node 152.

For example, as illustrated in FIG. 1A and FIG. 1B, the capacitor control circuit 123 can be configured to allow the first capacitor 121 and the second capacitor 122 to be connected in parallel or to be disconnected. For example, the capacitor control circuit 123 can comprise a fourth transistor T4 and a fifth transistor T5; a first terminal of the fourth transistor T4 can be electrically connected to the second node 152, a second terminal of the fourth transistor T4 can be electrically connected to a first terminal of the second capacitor 122; a first terminal of the fifth transistor T5 can be electrically connected to the first node 151, and a second terminal of the fifth transistor T5 can be electrically connected to a second terminal of the second capacitor 122. For example, according to specific implementation demands, a control terminal of the fourth transistor T4 and a control terminal of the fifth transistor T5 can be configured to be electrically connected to same one signal line or different signal lines. For example, in the case that the control terminal of the fourth transistor T4 and the control terminal of the fifth transistor T5 receive a turn-on signal (for example, a signal with a high voltage level), the first terminal of the fourth transistor T4 is electrically connected with the second terminal of the fourth transistor T4, and the first terminal of the fifth transistor T5 is electrically connected with the second terminal of the fifth transistor T5; in this case, the capacitor control circuit 123 allows the first capacitor 121 and the second capacitor 122 to be connected in parallel. For another example, in the case that the control terminal of the fourth transistor T4 and the control terminal of the fifth transistor T5 receive a turn-off signal (for example, a signal with a low voltage level), both the fourth transistor T4 and the fifth transistor T5 are in a turn-off (cut-off) state; in this case, the capacitor control circuit 123 allows the first capacitor 121 and the second capacitor 122 to be disconnected.

For example, as illustrated in FIG. 1A and FIG. 1B, the first sensing circuit 103 can be electrically connected to the first driving circuit 101 and the first organic light emitting element 131 and can be configured to sense the first driving circuit 101 or the first organic light emitting element 131. For example, the first sensing circuit 103 can comprise a third transistor T3; a first terminal of the third transistor T3 can be electrically connected to the first node 151, and a second terminal of the third transistor T3 can be configured to be electrically connected to a first monitoring line SENSE1. For example, in the case that the third transistor T3 is turned on, electrical signals outputted by the pixel circuit can be obtained through the first monitoring line SENSE1, and alternatively, electrical signals also can be inputted into the pixel circuit via the first monitoring line SENSE1.

Figure 2A:
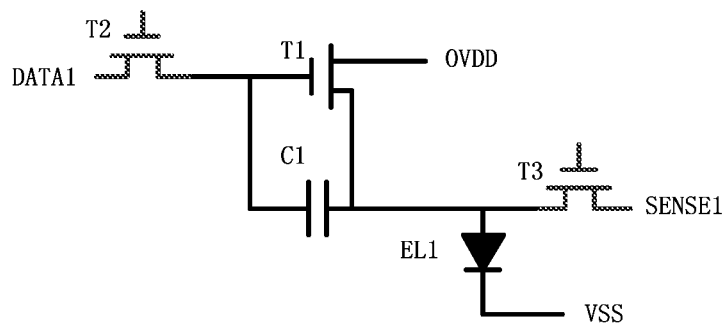
FIG. 2A is an equivalent circuit diagram of the schematic circuit diagram of the pixel circuit as illustrated in FIG. 1B during a light-emitting stage.

In a light-emitting stage, the control terminal of the fourth transistor T4 and the control terminal of the fifth transistor T5 receive a turn-off signal (for example, a signal with a low voltage level), the fourth transistor T4 and the fifth transistor T5 are in a turn-off state, the circuit diagram as illustrated in FIG. 1B can be equivalent to the circuit diagram as illustrated in FIG. 2A. In this case, the capacitor control circuit 123 renders the first capacitor 121 and the second capacitor 122 to be disconnected; because monitoring operations are not needed at this time, the control terminal of the third transistor T3 can receive a turn-off signal (for example, a signal with a low voltage level), such that the third transistor T3 is in a turn-off state, and alternatively, the third transistor T3 can also in a turn-on value; a low level voltage is applied into the first monitoring line SENSE1; in the case that the control terminal of the second transistor T2 receives a turn-on signal (for example, a signal with a high voltage level) and the first terminal of the second transistor T2 receives a data signal, the first capacitor C1 is charged, such that the voltage of the second node 152 is increased and the first transistor T1 is in a turn-on value. Therefore, the pixel circuit as illustrated in FIG. 1B can drive the first organic light emitting element 131 to emit light normally, that is, the pixel circuit as illustrated in FIG. 1B is in the light-emitting stage provided that the above-mentioned requirements are satisfied.

Figure 2B:
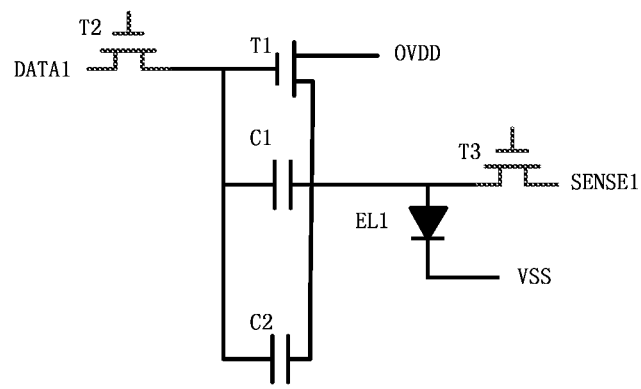
FIG. 2B is an equivalent circuit diagram of the schematic circuit diagram of the pixel circuit as illustrated in FIG. 1B during a first monitoring stage.
Figure 2C:
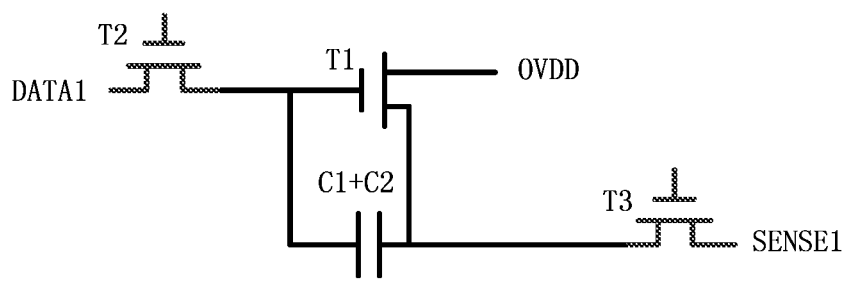
FIG. 2C is another equivalent circuit diagram of the schematic circuit diagram of the pixel circuit as illustrated in FIG. 1B during a first monitoring stage.

For example, in the monitoring stage, the first driving circuit 101 and/or the first organic light emitting element 131 can be monitored. The control terminal of the fourth transistor T4 and the control terminal of the fifth transistor T5 receives a turn-on signal, the circuit diagram as illustrated in FIG. 1B can be equivalent to the circuit diagram as illustrated in FIG. 2B. In this case, the capacitor control circuit 123 renders the first capacitor 121 and the second capacitor 122 to be connected in parallel, and therefore, the circuit diagram illustrated in FIG. 2B can further be equivalent to the circuit diagram illustrated in FIG. 2C, and the capacitance value to control the first driving circuit 101 is increased to C1+C2 from C1. In order to monitor the parameters of the first driving circuit, control signals are applied to enable the second transistor T2 and the third transistor T3 to be in a turn-on value, because an electrical signal (i.e., data signal, for example, reference data signal)

originated from the first data line DATA1 charges the first capacitor C1 and the second capacitor C2, which are connected in parallel, via the second transistor T2 in a turn-on value, the first transistor T1 can be in a turn-on value, and the driving current can flow through the first transistor T1 and the first organic light emitting element EL1 from the first power source terminal OVDD, and the driving current can be obtained by the first sensing circuit 103 (for example, the driving current is outputted to the first monitoring line SENSE1 via the third transistor T3 in a turn-on value), such that the first sensing circuit 103 can be used to monitor the electrical signal flowing through the first driving circuit 101 (for example, the first transistor T1), and to obtain the parameters of the first driving circuit 101 (for example, the threshold voltage of the first transistor T1), and for example, the parameters of the first driving circuit 101 can be used to determine the compensation value of the data signal.

For example, in order to monitor the parameter of the first organic light emitting element EL1, as illustrated in FIG. 1B, in the case that the control terminal of the third transistor T3 receives a turn-on signal (for example, a signal with a high voltage level), the control terminal of the second transistor T2 receives a turn-off signal (for example, a signal with a low voltage level) and the first data line DATA1, for example, outputs a signal with a high voltage level, the third transistor T3 is in a turn-on state, both the first transistor T1 and the second transistor T2 are in a turn-off state, the fourth transistor T4 and the fifth transistor T5 can also in a turn-off state when required; by inputting the electrical signal into the first organic light emitting element 131 through the first sensing circuit 103, the electrical signal flow through the first organic light emitting element 131 can be monitored, therefore monitoring of the first organic light emitting element 131 can be realized, and the parameter of the first organic light emitting element 131 (for example, the internal resistance of the first organic light emitting element 131) can be obtained, and for example, compensation values of the driving current can be determined based on the parameter.

Figure 2D:
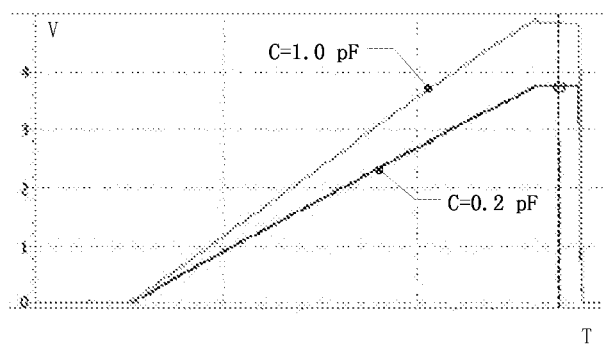
FIG. 2D is a curve to illustrate a change of a sensing voltage value obtained by a sensing circuit over time.

For example, FIG. 2D is a curve to illustrate the change of a sensing voltage value obtained by a sensing circuit over time; as illustrated in FIG. 2D, in the case that the capacitance value to control the driving circuit is increased from 0.2 pF to 1 pF, the charging speed in the sensing stage is increased and the sensed value is more accurate (the sensing voltage obtained by the sensing circuit is increased from 3.74 V to 4.8V). For example, for the pixel circuit provided by an embodiment of present disclosure, because the capacitance value to control the first driving circuit 101 is increased to C1+C2 in the first monitoring stage, the charging speed in the sensing stage is accelerated, and the accuracy of the sensed value obtained by the first sensing circuit 103 is increased, and therefore, a more accurate electrical signal can be provided in the compensation stage of the pixel circuit, and the compensation effect of the pixel circuit is improved.

For example, the settings of the first monitoring stage and the display stage can be provided according to specific implementation demands, and no specific limitations are given to the embodiment of present disclosure in this aspect. For example, a display panel, which includes the pixel circuit provided by an embodiment of present disclosure, can comprise a first monitoring stage and a display stage, the first monitoring stage of each display period can be in a time period before the display stage, therefore, the aging degree of the first driving circuit 101 and/or the first organic light emitting element 131 can be determined in a timely manner, and the sensed value updated in each display period can be used to compensate the pixel circuit, such that better compensation effect for the pixel circuit can be realized. For another example, the sensed value can be obtained, with the first sensing circuit 103, only during an initial stage immediately after the display panel including the pixel circuit is switched on each time, and compensation of the pixel circuit is performed with the obtained sensed value, such that power consumptions can be reduced with good compensation of the pixel circuit being realized.

Figure 3A:
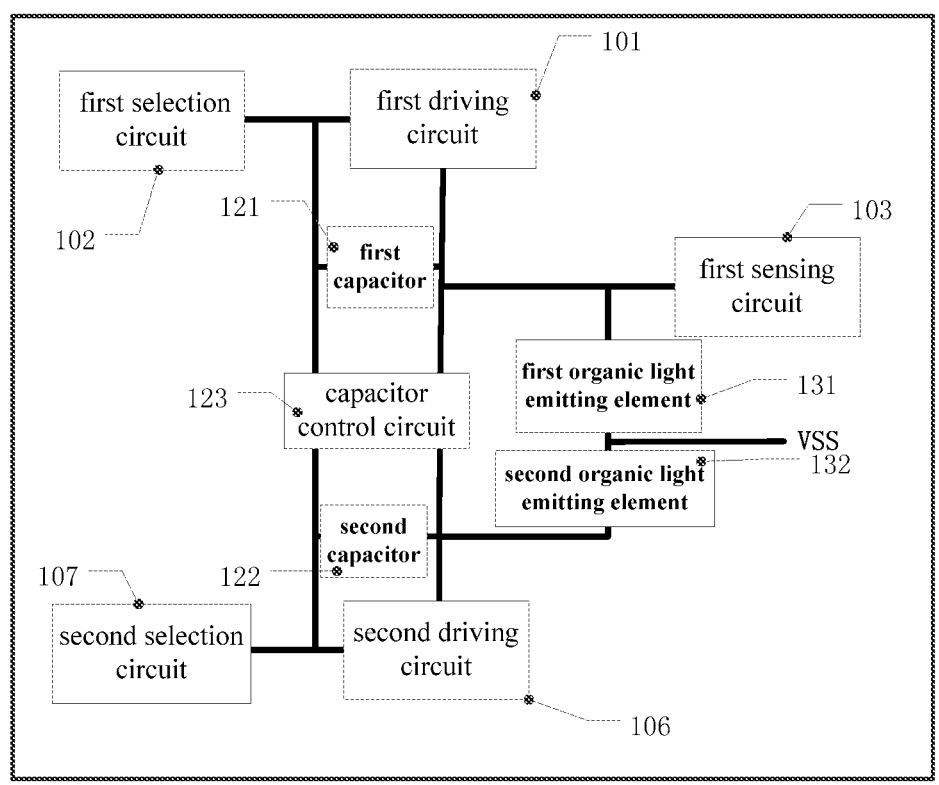
FIG. 3A is a schematic block diagram of another pixel circuit provided by an embodiment of present disclosure.

For example, FIG. 3A is a schematic block diagram of another pixel circuit provided by an embodiment of present disclosure, and the pixel circuit illustrated in FIG. 3A can comprise a second selection circuit 107, a second driving circuit 106 and a second organic light emitting element 132 compared to the pixel circuit illustrated in FIG. 1A. For example, concrete structures of the second selection circuit 107, the second driving circuit 106 and the second organic light emitting element 132 can be set according to specific implementation demands, and no limitations are given in the present disclosure in this aspect. For example, the pixel circuit provided by an embodiment of present disclosure can be implemented as the circuit diagram as illustrated in FIG. 3B.

Figure 3B:
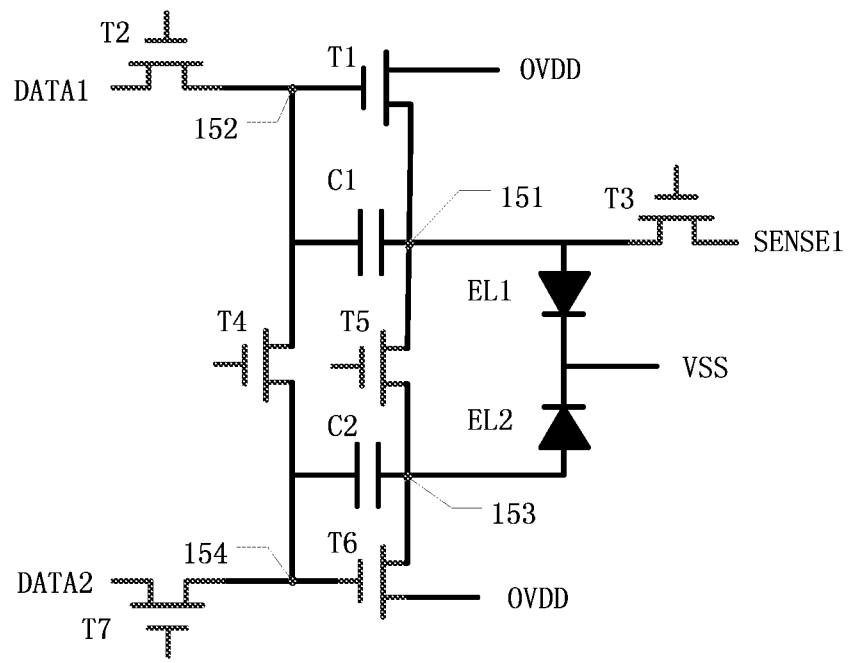
FIG. 3B is a schematic circuit diagram of the pixel circuit as illustrated in FIG. 3A.

For example, as illustrated in FIG. 3A and FIG. 3B, the second driving circuit 106 can be electrically connected to the second organic light emitting element 132 and can be configured to drive the second organic light emitting element 132 (for example, element EL2 illustrated in FIG. 3B). For example, the second driving circuit 106 can comprise a sixth transistor T6. For example, the pixel circuit can also comprise a third node 153 and a fourth node 154, a first terminal of the sixth transistor T6 can be configured to be electrically connected to the first power source terminal OVDD, a second terminal of the sixth transistor T6 can be electrically connected to the third node 153, and a control terminal of the sixth transistor T6 can be electrically connected to the fourth node 154.

For example, as illustrated in FIG. 3A and FIG. 3B, a first terminal of the second organic light emitting element 132 can be electrically connected to the third node 153, and a second terminal of the second organic light emitting element 132 can be configured to be electrically connected to the second power source terminal VSS. For example, according to specific implementation demands, the second organic light emitting element 132 and the first organic light emitting element 131 can be driven individually, and light emitted by the second organic light emitting element 132 and light emitted by the first organic light emitting element 131 can be same or different in color, and no specific limitations are given in the embodiment of present disclosure in this aspect. For example, in the case that the control terminal of the sixth transistor T6 receives a turn-on signal, an electrical signal (for example, current signal) originated from the first power source terminal OVDD can drive the second organic light emitting element 132 to emit light.

For example, as illustrated in FIG. 3A and FIG. 3B, the second selection circuit 107 and the second capacitor 122 (for example, the element C2 illustrated in FIG. 3B) can be configured to control the second driving circuit 106. For example, the second selection circuit 107 can comprise a seventh transistor T7; a first terminal of the seventh transistor T7 can be configured to be electrically connected to a second data line DATA2, and a second terminal of the seventh transistor T7 can be electrically connected to the fourth node 154. For example, the first data line DATA1 and the second data line DATA2 can be two different data lines. For example, in the case that the seventh transistor T7 receives a turn-on signal, an electrical signal originated from the second data line DATA2 can be transmitted to the control terminal of the sixth transistor T6 via the seventh transistor T7 and is stored into the second capacitor C2 so as to change the voltage of the fourth node 154, such that the sixth transistor T6 can be in a turn-on value when required at a later time so as to drive the second organic light emitting element EL2. For example, the first terminal of the second capacitor 122 can be electrically connected to the fourth node 154, and the second terminal of the second capacitor 122 can be electrically connected to the third node 153.

Figure 4A:
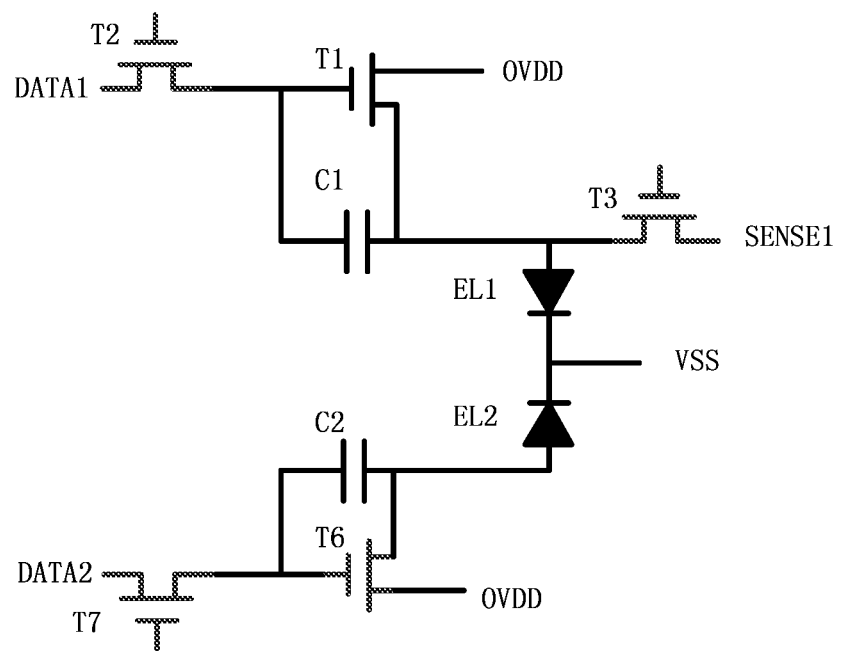
FIG. 4A is an equivalent circuit diagram of the schematic circuit diagram of the pixel circuit as illustrated in FIG. 3B during a light-emitting stage.

For example, in a light-emitting stage, the control terminal of the fourth transistor T4 and the control terminal of the fifth transistor T5 receive a turn-off signal, the fourth transistor T4 and the fifth transistor T5 are in a turn-off state, the circuit diagram illustrated in FIG. 3B can be equivalent to the circuit diagram illustrated in FIG. 4A. In this case, the capacitor control circuit 123 disconnects the first capacitor 121 from the second capacitor 122; because monitoring operations are not needed at this time, the control terminal of the third transistor T3 receives a turn-off signal (for example, a signal with a low voltage level), such that the third transistor T3 is in a turn-off state, and alternatively, the third transistor T3 can also in a turn-on value; a low level voltage is applied into the first monitoring line SENSE1; similar to the above-mentioned descriptions, the second transistor T2 and the first capacitor C1 can cooperate with each other so as to control the first transistor T1 according to the signals over the first signal line DATA1; independently, the seventh transistor T7 and the second capacitor C2 can cooperate with each other so as to control the sixth transistor T6 according to the signals over the second signal line DATA2; therefore, the pixel circuit illustrated in FIG. 3B can drive the first organic light emitting element 131 and the second organic light emitting element 132 to emit light normally.

Figure 4B:
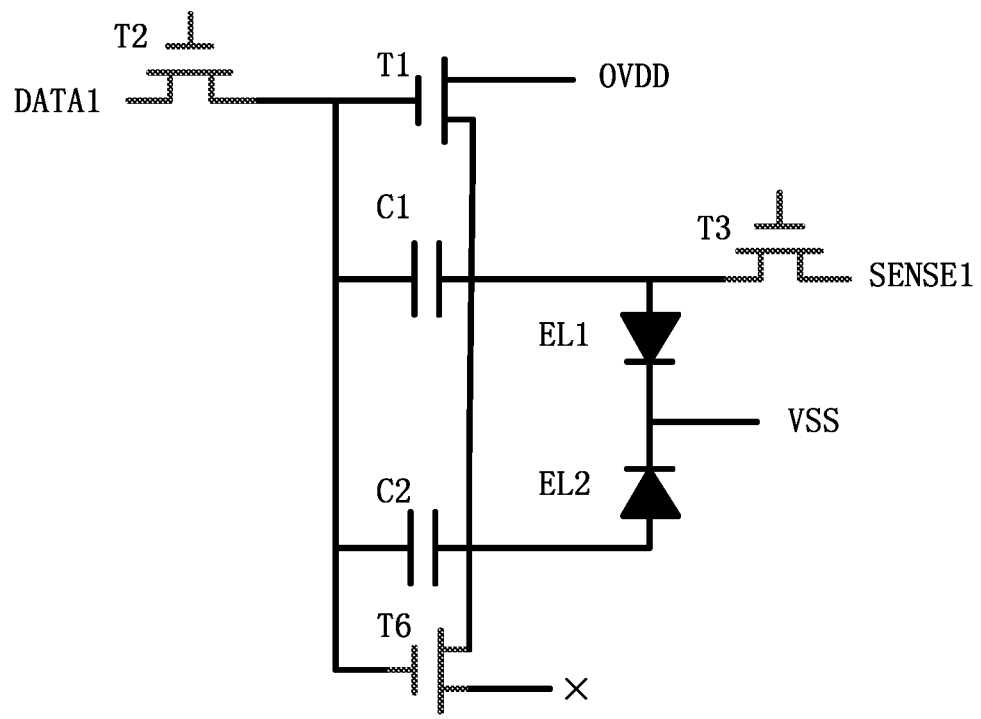
FIG. 4B is an equivalent circuit diagram of the schematic circuit diagram of the pixel circuit as illustrated in FIG. 3B during a first monitoring stage.
Figure 4C:
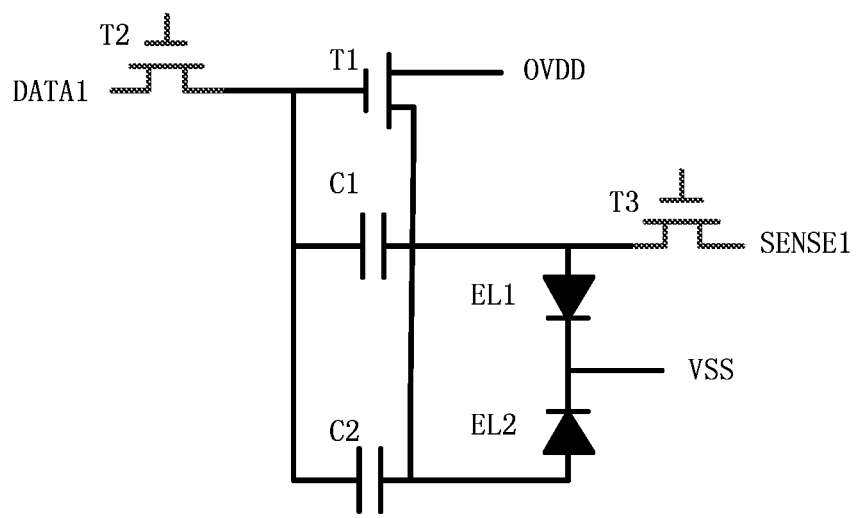
FIG. 4C is another equivalent circuit diagram of the schematic circuit diagram of the pixel circuit as illustrated in FIG. 3B during a first monitoring stage.
Figure 4D:
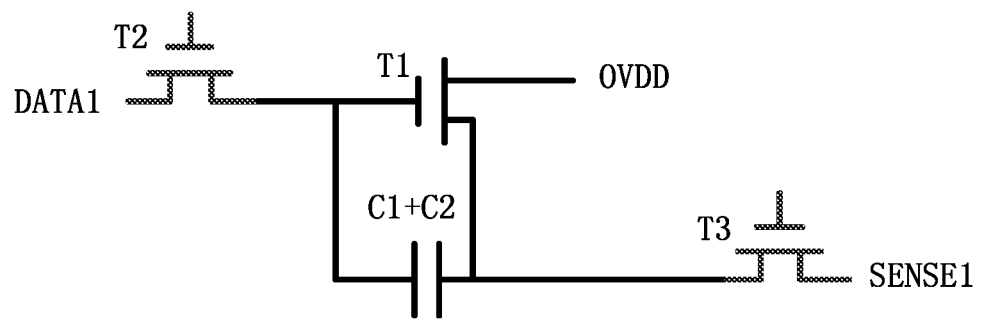
FIG. 4D is further another equivalent circuit diagram of the schematic circuit diagram of the pixel circuit as illustrated in FIG. 3B during a first monitoring stage.

For example, in a first monitoring stage (for example, the first driving circuit 101 and/or the first organic light emitting element 131 can be monitored), the control terminal of the fourth transistor T4 and the control terminal of the fifth transistor T5 receive a turn-on signal, and therefore, the fourth transistor T4 and the fifth transistor T5 are in a turn-on value, and the circuit diagram illustrated in FIG. 3B can be equivalent to the circuit diagram illustrated in FIG. 4B. In this case, the capacitor control circuit 123 renders the first capacitor 121 and the second capacitor 122 to be connected in parallel; furthermore, the first terminal of the sixth transistor T6 is disconnected from the first power source terminal OVDD (for example, in a suspension state), therefore, the circuit diagram illustrated in FIG. 4B can further be equivalent to the circuit diagrams illustrated in FIG. 4C and FIG. 4D, and thus the capacitance value to control the first driving circuit 101 is increased from C1 to C1+C2. Therefore, the first driving circuit 101 and/or the first organic light emitting element 131 can be monitored in a similar manner.

For example, for another pixel circuit provided by an embodiment of present disclosure, not only the charging speed in the sensing stage is accelerated, the accuracy of the sensed value obtained by the first sensing circuit 103 is increased, and the compensation effect of the pixel circuit is improved, but also the capacitance value can be increased and the compensation effect of the pixel circuit can be improved by using the capacitor in adjacent pixel. Because no additional capacitor is required for each pixel to be connected in parallel with the each pixel, and no capacitor with greater capacitance is required, the manufacturing cost can be reduced and the aperture ratio of the display panel including the pixel circuit can be increased.

Figure 5A:
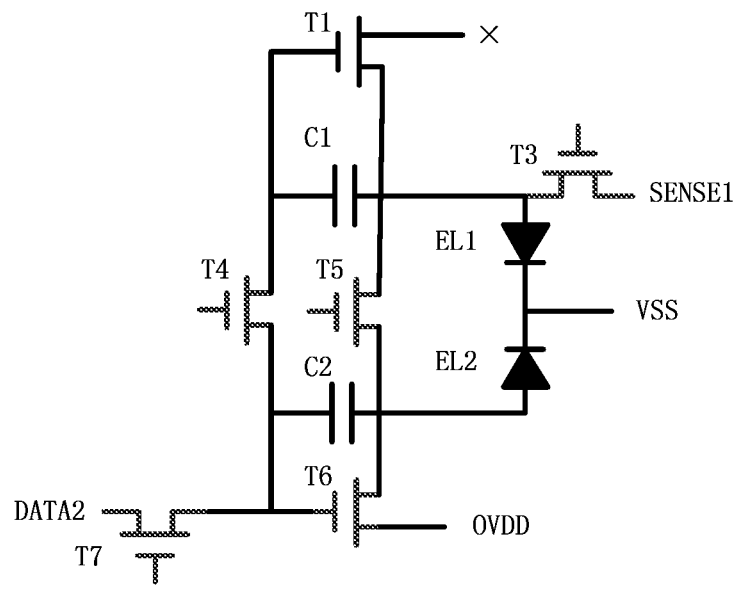
FIG. 5A is an equivalent circuit diagram of the schematic circuit diagram of the pixel circuit as illustrated in FIG. 3B during a second monitoring stage.
Figure 5B:
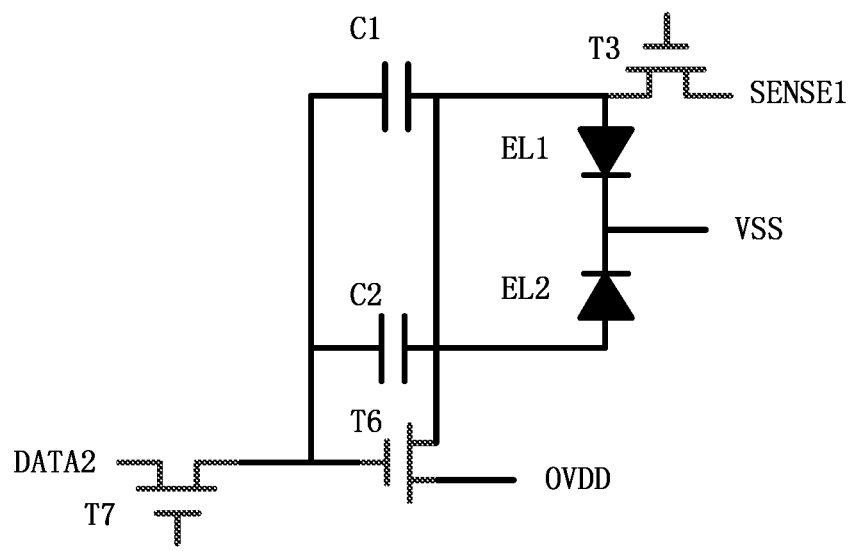
FIG. 5B is another equivalent circuit diagram of the schematic circuit diagram of the pixel circuit as illustrated in FIG. 3B during a second monitoring stage.
Figure 5C:
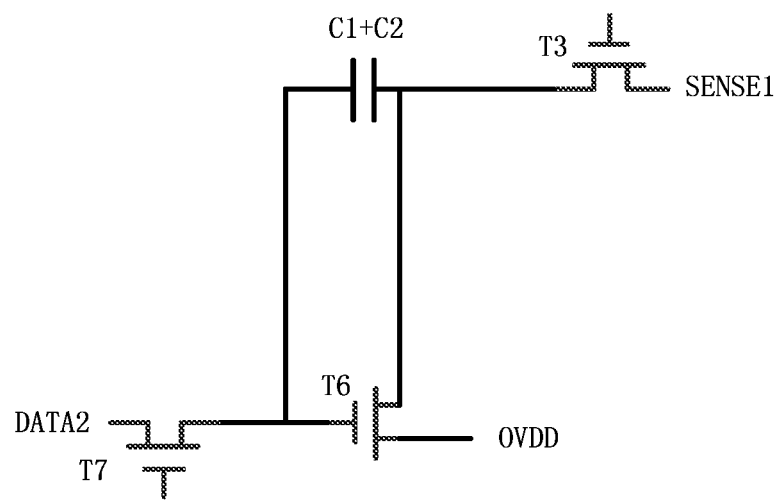
FIG. 5C is further another equivalent circuit diagram of the schematic circuit diagram of the pixel circuit as illustrated in FIG. 3B during a second monitoring stage.

For example, in a second monitoring stage (for example, the second driving circuit 106 and/or the second organic light emitting element 132 can be monitored), the control terminal of the fourth transistor T4 and the control terminal of the fifth transistor T5 receive a turn-on signal similarly, the fourth transistor T4 and the fifth transistor T5 are in a turn-on value, the circuit diagram illustrated in FIG. 3B can be equivalent to the circuit diagram illustrated in FIG. 5A. In this case, the capacitor control circuit 123 enables the first capacitor 121 and the second capacitor 122 to be connected in parallel; furthermore, the first terminal of the first transistor T1 is disconnected from the first power source terminal OVDD (for example, in a suspension state), therefore, the circuit diagram illustrated in FIG. 5A can further be equivalent to the circuit diagrams illustrated in FIG. 5B and FIG. 5C, and the capacitance value to control the second driving circuit 106 is increased to C1+C2 from C1, such that the second driving circuit 106 can be monitored similarly. Furthermore, the second organic light emitting element 132 can also be monitored, specific monitoring method can refer to the monitoring method of the first organic light emitting element 131 in the pixel circuit illustrated in FIG. 1B, and no further redundant descriptions will be given here. For example, the third transistor T3 can be in a turn-on value, and electrical signals can be inputted into the first organic light emitting element 131 and the second organic light emitting element 132 via the first sensing circuit 103, such that electrical signals flowing through the first organic light emitting element 131 and the second organic light emitting element 132 can be monitored, therefore, information including electrical signals of the second organic light emitting element 132 can be obtained, and thus monitoring of the second organic light emitting element 132 can be realized and the parameter of the second organic light emitting element 132 can be obtained; for example, compensation values of the driving current can be determined based on the parameter. Because the parameter obtained through the above-mentioned monitoring method can comprise information related to the first organic light emitting element 131, the compensation effect of the second organic light emitting element 132 can be affected.

For example, for another pixel circuit provided by an embodiment of present disclosure, not only the charging speed in the sensing stage is accelerated, the accuracy of the sensed value obtained by the first sensing circuit 103 is increased, and the compensation effect of the pixel circuit is improved, in the case that no additional capacitor is provided for each pixel to be connected in parallel with the each pixel and no capacitor with greater capacitance is provided, but also only one sensing circuit is provided for two pixels, such that the manufacturing cost can be further reduced and the aperture ratio of the display panel including the pixel circuit can be further increased.

Figure 6A:
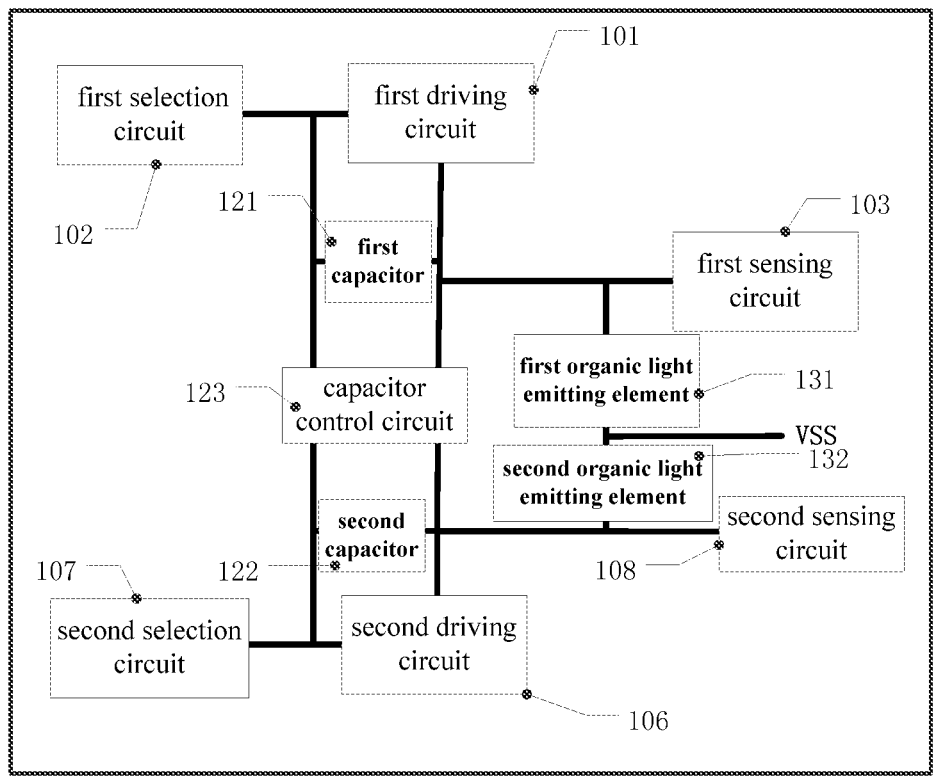
FIG. 6A is a schematic block diagram of further another pixel circuit provided by an embodiment of present disclosure.

For example, FIG. 6A is a schematic block diagram of further another pixel circuit provided by an embodiment of present disclosure, the pixel circuit illustrated in FIG. 6A can also comprise a second sensing circuit 108 compared to the pixel circuit illustrated in FIG. 3A. For example, the concrete structure of the second sensing circuit 108 can be set according to specific implementation demands, no limitations are given in the present disclosure in this aspect. For example, the pixel circuit provided by an embodiment of present disclosure can be implemented as the circuit diagram illustrated in FIG. 6B.

Figure 6B:
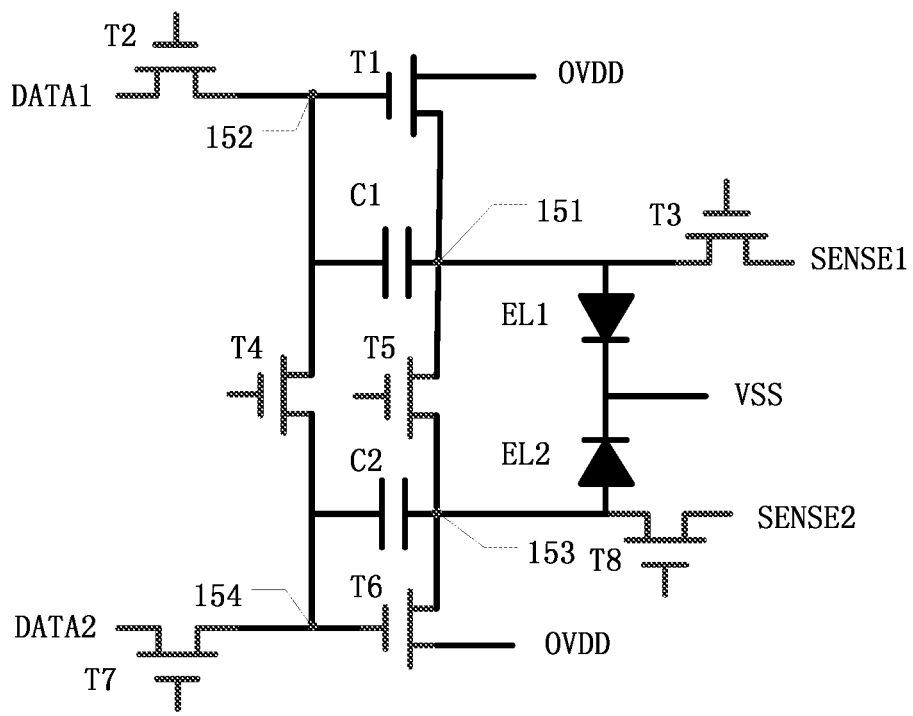
FIG. 6B is a schematic circuit diagram of the pixel circuit illustrated in FIG. 6A.

For example, as illustrated in FIG. 6A and FIG. 6B, the second sensing circuit 108 can be electrically connected to the second driving circuit 106 and the second organic light emitting element 132 and can be configured to sense the second driving circuit 106 or the second organic light emitting element 132. For example, the second sensing circuit 108 can comprise an eighth transistor T8, a first terminal of the eighth transistor T8 can be electrically connected to the third node 153, and a second terminal of the eighth transistor T8 can be configured to be electrically connected to the second monitoring line SENSE2.

Figure 7A:
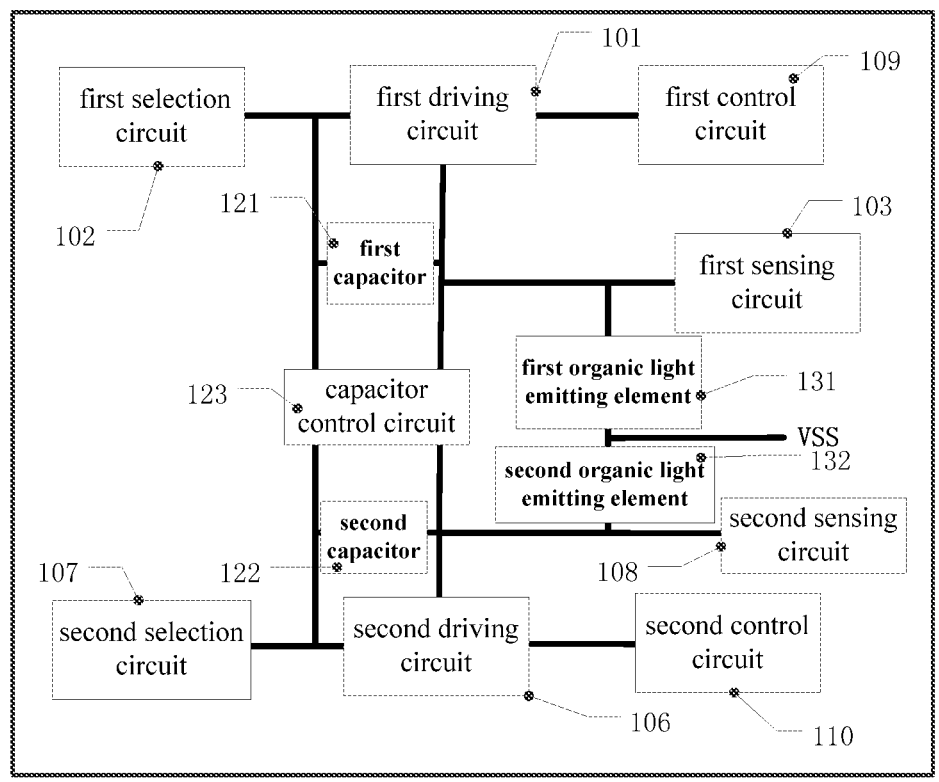
FIG. 7A is a schematic block diagram of further another pixel circuit provided by an embodiment of present disclosure.

For example, FIG. 7A is a schematic block diagram of further another pixel circuit provided by an embodiment of present disclosure, the pixel circuit illustrated in FIG. 7A can also comprise a first control circuit 109 and a second control circuit 110 compared to the pixel circuit illustrated in FIG. 6A. For example, concrete structures of the first control circuit 109 and the second control circuit 110 can be set according to specific implementation demands, no limitations are given in the present disclosure in this aspect. For example, the pixel circuit provided by an embodiment of present disclosure can be implemented as the circuit diagram illustrated in FIG. 7B.

Figure 7B:
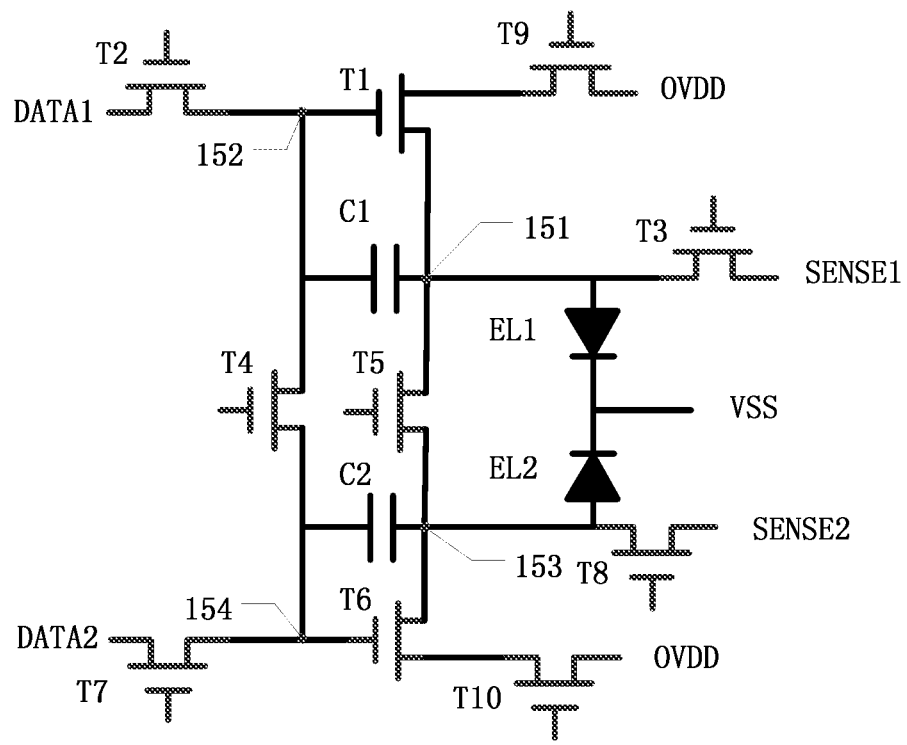
FIG. 7B is a schematic circuit diagram of the pixel circuit illustrated in FIG. 7A.

For example, as illustrated in FIG. 7A and FIG. 7B, the first control circuit 109 can be configured to control whether or not the first driving circuit 101 is electrically connected to the first power source terminal OVDD, and the second control circuit 110 can be configured to control whether or not the second driving circuit 106 is electrically connected to the first power source terminal OVDD. For example, the first control circuit 109 can comprise a ninth transistor T9; the second control circuit 110 can comprise a tenth transistor T10; a first terminal of the ninth transistor T9 can be electrically connected to the first terminal of the first transistor T1, and a second terminal of the ninth transistor T9 can be configured to be electrically connected to the first power source terminal OVDD; a first terminal of the tenth transistor T10 can be electrically connected to the first terminal of the sixth transistor T6, and a second terminal of the tenth transistor T10 can be configured to be electrically connected to the first power source terminal OVDD. For example, in the case that the control terminal of the first control circuit 109/the control terminal of the second control circuit 110 receives a turn-on signal, the electrically connection between the first power source terminal OVDD and the first driving circuit 101/the second control circuit 110 can be realized.

Figure 8A:
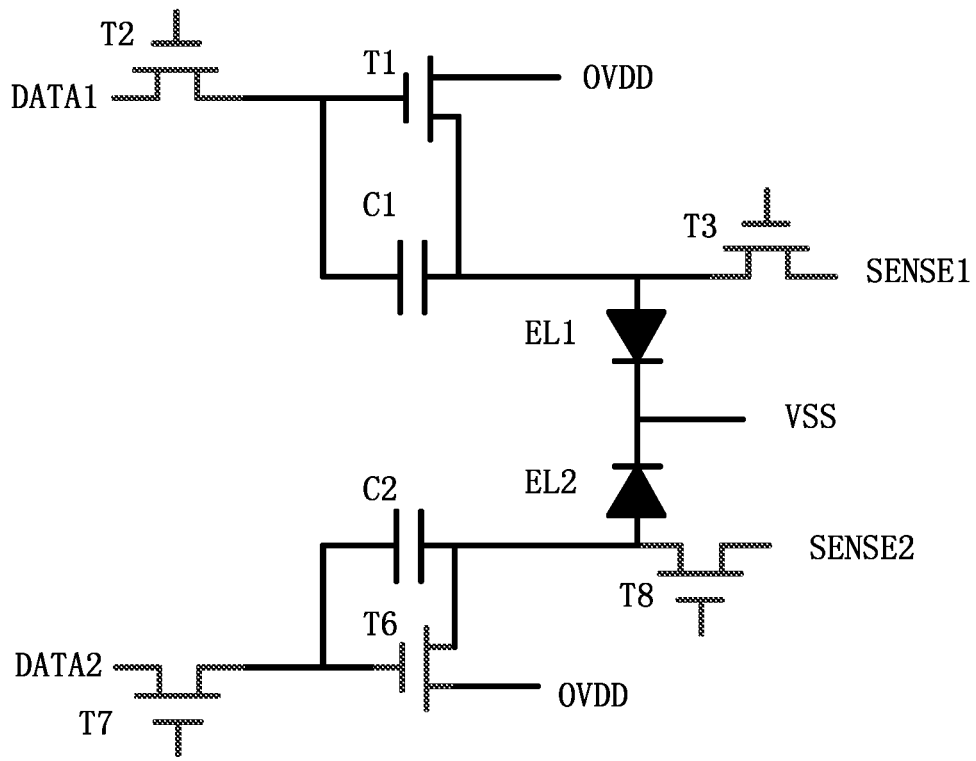
FIG. 8A is an equivalent circuit diagram of the schematic circuit diagram of the pixel circuit as illustrated in FIG. 7B during a light-emitting stage.

For example, in a light-emitting stage, the control terminal of the fourth transistor T4 and the control terminal of the fifth transistor T5 receive a turn-off signal, and therefore the fourth transistor T4 and the fifth transistor T5 are in a turn-off state; the control terminals of the second transistor T2, the seventh transistor T7 and the ninth transistor T9 to the tenth transistor T10 receive a turn-on signal, and therefore, the second transistor T2, the seventh transistor T7, the ninth transistor T9 to the tenth transistor T10 are in a turn-on value. Apparently, because monitoring operations are not needed in such a case, the third transistor T3 and the eighth transistor T8 can be in a turn-off state, or alternatively, the third transistor T3 and the eighth transistor T8 are also allowed to be in a turn-on value. Low level voltages are applied into the first monitoring line SENSE1 and the second monitoring line SENSE2; similar to the above-mentioned descriptions, the second transistor T2 and the first capacitor C1 can cooperate with each other so as to control the first transistor T1 according to the signals over the first signal line DATA1; independently the seventh transistor T7 and the second capacitor C2 can cooperate with each other so as to control the sixth transistor T6 according to the signals over the second signal line DATA2; therefore, the circuit diagram illustrated in FIG. 7B can be equivalent to the circuit diagram illustrated in FIG. 8A. In this case, the capacitor control circuit 123 allows the first capacitor 121 and the second capacitor 122 to be disconnected, and thus, the pixel circuit illustrated in FIG. 7B can drive the first organic light emitting element 131 and the second organic light emitting element 132 to emit light normally.

Figure 8B:
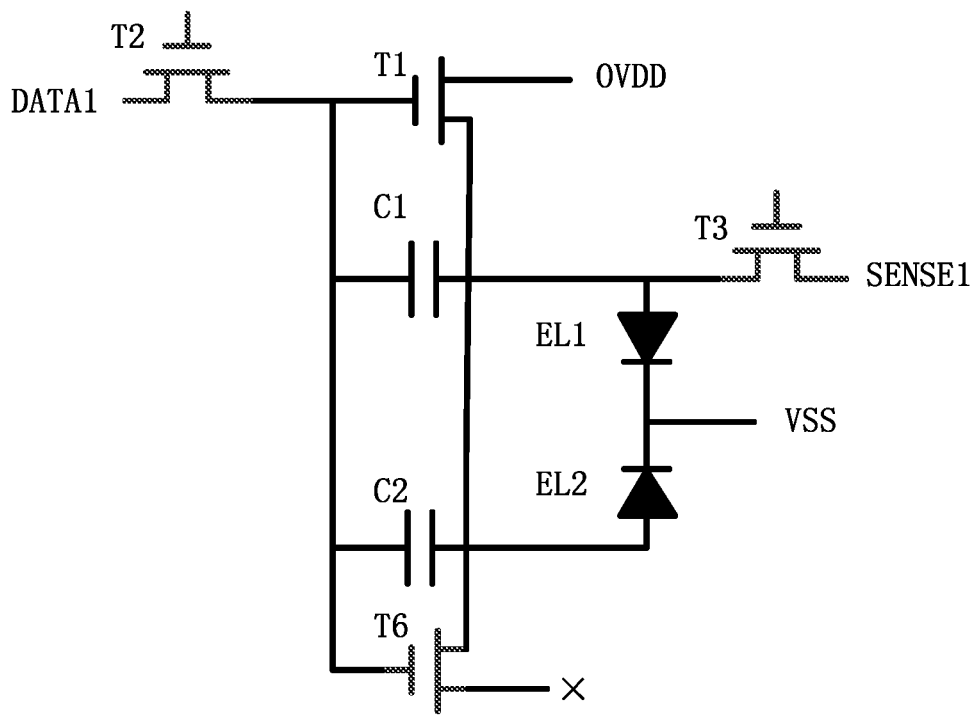
FIG. 8B is an equivalent circuit diagram of the schematic circuit diagram of the pixel circuit as illustrated in FIG. 7B during a first monitoring stage.
Figure 8C:
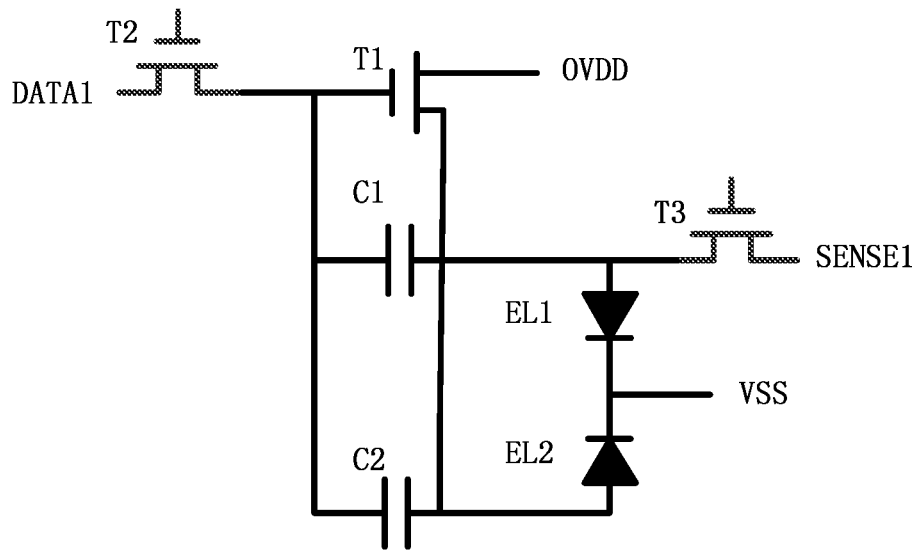
FIG. 8C is another equivalent circuit diagram of the schematic circuit diagram of the pixel circuit as illustrated in FIG. 7B during a first monitoring stage.
Figure 8D:
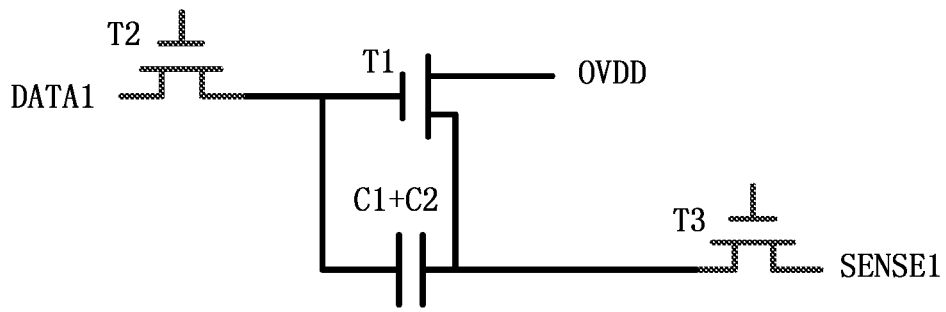
FIG. 8D is further another equivalent circuit diagram of the schematic circuit diagram of the pixel circuit illustrated in FIG. 7B during a first monitoring stage.

For example, in a first monitoring stage, the control terminal of the fourth transistor T4 and the control terminal of the fifth transistor T5 receive a turn-on signal, the fourth transistor T4 and the fifth transistor T5 are in a turn-on value, the ninth transistor T9 is in a turn-on value, but the tenth transistor T10 is in a turn-off state, the circuit diagram illustrated in FIG. 7B can be equivalent to the circuit diagram illustrated in FIG. 8B. In this case, the capacitor control circuit 123 renders the first capacitor 121 and the second capacitor 122 to be connected in parallel, therefore the circuit diagram illustrated in FIG. 8B can further be equivalent to the circuit diagrams illustrated in FIG. 8C and FIG. 8D, and the capacitance value to control the first driving circuit 101 is increased to C1+C2 from C1; the charging speed in the sensing stage is accelerated, and the accuracy of the sensed value obtained by the first sensing circuit 103 is increased, and therefore, a more accurate electrical signal can be provided in a compensation stage of the pixel circuit, and the compensation effect of the pixel circuit is improved.

Figure 9A:
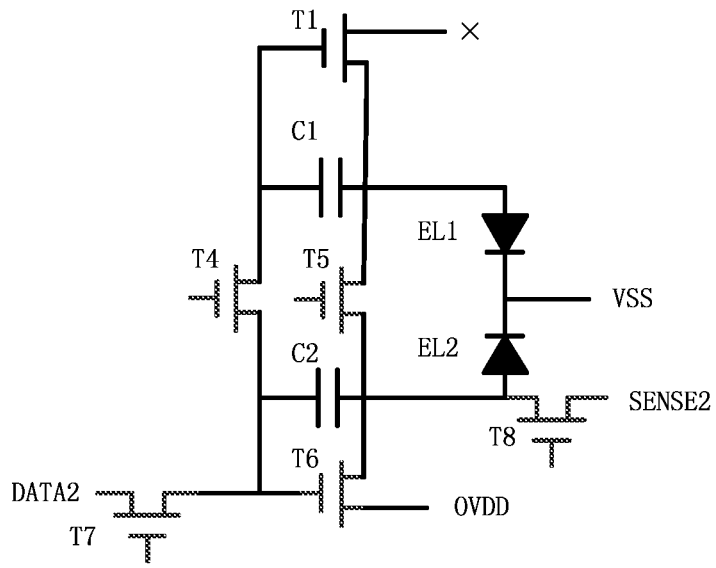
FIG. 9A is an equivalent circuit diagram of the schematic circuit diagram of the pixel circuit as illustrated in FIG. 7B during a second monitoring stage.
Figure 9B:
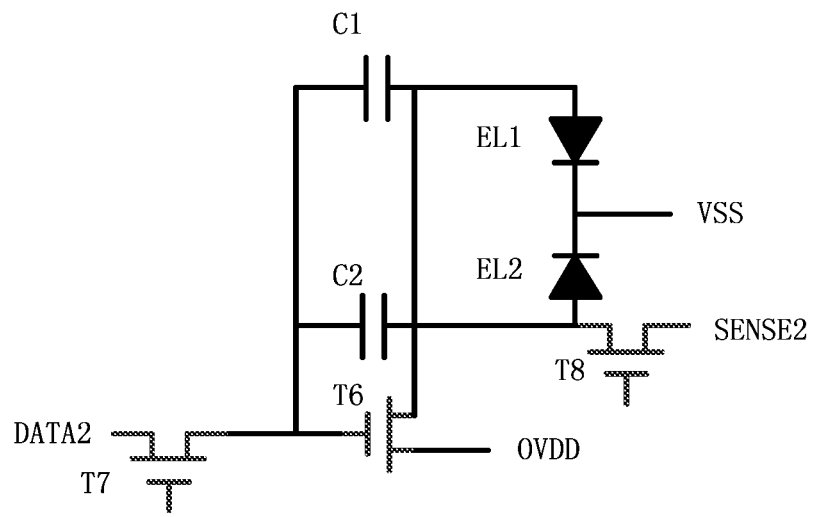
FIG. 9B is another equivalent circuit diagram of the schematic circuit diagram of the pixel circuit as illustrated in FIG. 7B during a second monitoring stage.
Figure 9C:
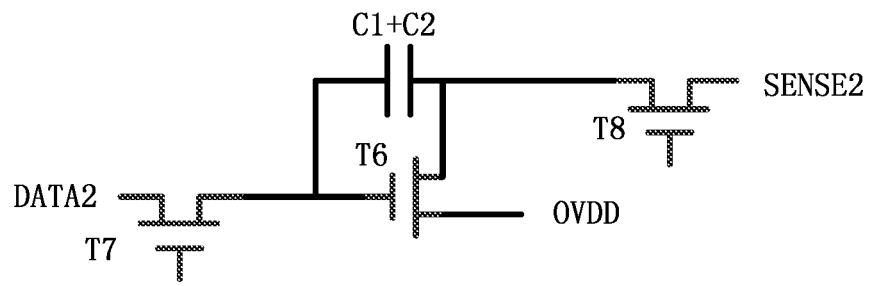
FIG. 9C is further another equivalent circuit diagram of the schematic circuit diagram of the pixel circuit as illustrated in FIG. 7B during a second monitoring stage.

For example, in a second monitoring stage, similarly, the control terminal of the fourth transistor T4 and the control terminal of the fifth transistor T5 receive a turn-on signal, the fourth transistor T4 to the fifth transistor T5 are in a turn-on value, the tenth transistor T10 is in a turn-on value while the ninth transistor T9 is in a turn-off state, the circuit diagram illustrated in FIG. 7B can be equivalent to the circuit diagram illustrated in FIG. 9A. In this case, the capacitor control circuit 123 renders the first capacitor 121 and the second capacitor 122 to be connected in parallel, therefore, the circuit diagram illustrated in FIG. 9A can further be equivalent to the circuit diagrams illustrated in FIG. 9B and FIG. 9C, and the capacitance value to control the second driving circuit 106 is increased to C1+C2 from C2; therefore, the charging speed in the sensing stage is accelerated, and the accuracy of the sensed value obtained by the second sensing circuit 108 is increased, and a more accurate electrical signal can be provided in a compensation stage of the pixel circuit, and the compensation effect of the pixel circuit is improved. Apparently, in the second monitoring stage, the second driving circuit 106 and/or the second organic light emitting element 132 also can be monitored with the first sensing circuit 103, and details can refer to the embodiments illustrated in FIG. 5A-FIG. 5C, and no further descriptions will be given here.

Figure 14:
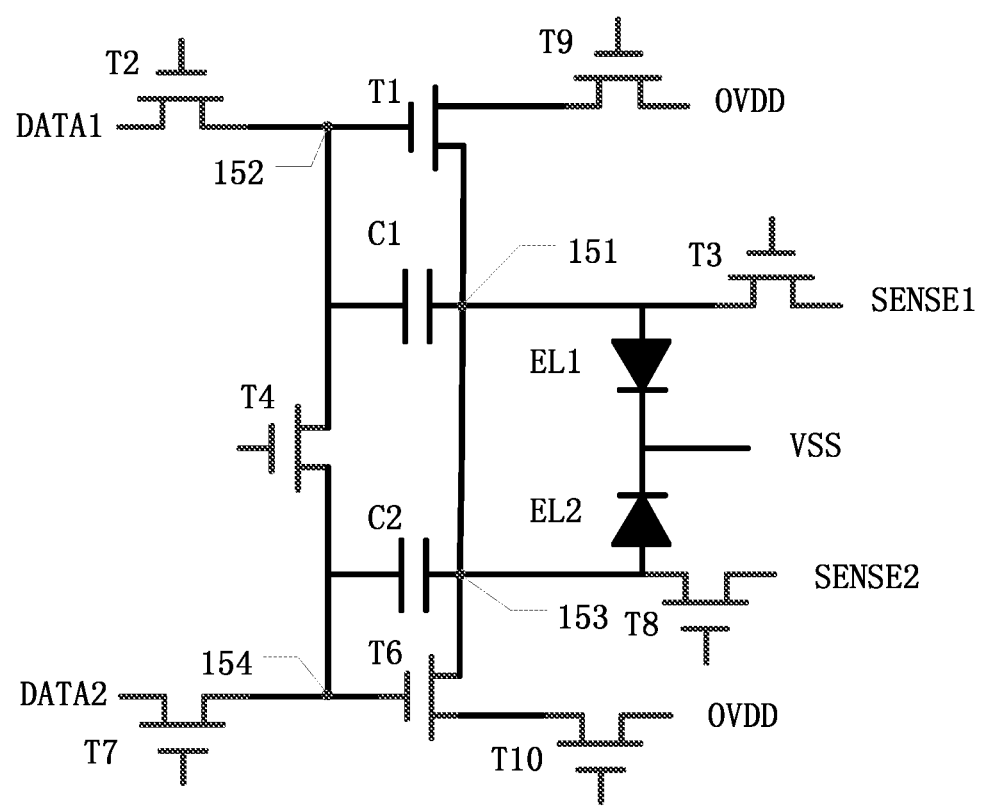
FIG. 14 is a schematic circuit diagram of further another pixel circuit provided by an embodiment of present disclosure.

It should be understood that the settings of the capacitor control circuit 123 is not limited to the structure including two transistors (for example, the fourth transistor T4 and the fifth transistor T5) which is illustrated in the above-mentioned embodiments (for example, the embodiments illustrated in FIG. 7B). For example, as illustrated in FIG. 14, according to specific implementation demands, the capacitor control circuit 123 can also comprise one transistor, for example, the capacitor control circuit 123 can comprise the fourth transistor T4 only. For example, compared to the pixel circuit illustrated in FIG. 7B, in the pixel circuit illustrated in FIG. 14, a first terminal of the second capacitor C2 is electrically connected to the second terminal of the fourth transistor T4; a second terminal of the second capacitor C2 is electrically connected to the first node and the third node; a first terminal of the first capacitor C1 is electrically connected to the first node and the third node, and a second terminal of the first capacitor C1 is electrically connected to the second node. For example, for the embodiments illustrated in FIG. 14, because the capacitor control circuit 123 comprises only one transistor, the pixel circuit structure is simplified and the cost of the pixel circuit can be reduced.

Figure 10:
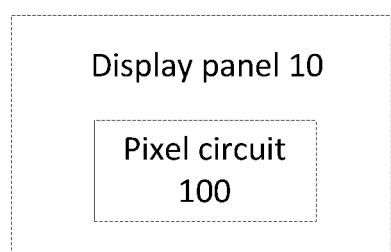
FIG. 10 is a schematic block diagram of a display panel provided by another embodiment of present disclosure.

FIG. 10 is a schematic block diagram of a display panel provided by another embodiment of present disclosure; the display panel comprises a sub-pixel array, the sub-pixel array comprises a plurality of sub-pixel, each sub-pixel can comprise the pixel circuit provided by at least one embodiment of present disclosure, or two adjacent sub-pixel can comprise the pixel circuit provided by at least one embodiment of present disclosure. It should be noted that other components (for example, a gate driving circuit, a data driving circuit, a power source driving circuit, a sensing driving circuit and the like) of the display panel can adopt conventional components, this should be understood by those skilled in the art, no further descriptions will be given herein and it should not be construed as a limitation on the embodiments of the present disclosure. The display panel provided by the embodiment of present disclosure can accelerate the charging speed in the sensing stage, improves the accuracy of the sensed value, and therefore can improve the compensation effect.

It should be understood that the transistors adopted in the embodiments of present disclosure can be thin film transistors or field-effect transistors or other switching devices with similar characteristics. A source electrode and a drain electrode of the adopted transistor can be symmetrical in structure, and therefore, there is no difference in the structures of the source electrode and the drain electrode of the transistor. In the embodiments of present disclosure, in order to distinguish two terminals of the transistors other than a gate electrode, which used as a control terminal, one terminal of the two terminals is denoted as a first terminal, and the other terminal of the two terminals is denoted as a second terminal, and therefore, the first terminal and the second terminal of all of or part of the transistors in the embodiment of present disclosure can be interchangeable when required. For example, the first terminal of the transistor in the embodiment of present disclosure can be a source electrode, and the second terminal of the transistor can be a drain electrode; or alternatively, the first terminal of the transistor can be a drain electrode, and the second terminal of the transistor can be a source electrode. Furthermore, the transistors can be divided into N type transistors and P type transistors according to the characteristics of the transistors, no specific limitation are given to the embodiment of present disclosure regarding types of the transistors, and those skilled in the art can implement the embodiments of present disclosure with N type transistors and/or P type transistors according actual demands.

The embodiments of present disclosure comprises but not limited to the pixel circuit illustrated in FIG. 1A to FIG. 9C. For example, the pixel circuit can also comprise other sub-circuits, for example, a reset circuit used for resetting a gate electrode of the first transistor, or, for example, also can comprise an internal compensation circuit, no further descriptions will be given herein.

The organic light emitting element provided by the embodiment of present disclosure is, for example, an organic light emitting diode, the organic light emitting diode can implemented into various types, for example, top emitting type or bottom emitting type, and the organic light emitting diode can be made by polymers, small molecules or the like.

Further another embodiment of present disclosure provides a driving method for the pixel circuit, the driving method for the pixel circuit comprises: in a first monitoring stage, allowing the capacitor control circuit to connect the first capacitor and the second capacitor in parallel, and allowing the first sensing circuit to monitor the first driving circuit or the first organic light emitting element.

For example, FIG. 11A is a schematic flow chart of a driving method of a pixel circuit provided by further another embodiment of present disclosure. For example, by taken the pixel circuit illustrated in FIG. 1A and FIG. 11B as an example, as illustrated in FIG. 11A, the driving method of the pixel circuit can comprise the following steps:

Step S110: in a first monitoring stage M1, allowing the capacitor control circuit to connect the first capacitor and the second capacitor in parallel, and allowing the first sensing circuit to monitor the first driving circuit or the first organic light emitting element;

Step S120: in a light-emitting stage EL, allowing the capacitor control circuit to disconnect the first capacitor from the second capacitor, and allowing the driving circuit to drive the first organic light emitting element to work.

For example, FIG. 11B is a schematic timing diagram of the driving method illustrated in FIG. 11A. For example, the control terminals of the second transistor T2 to the fifth transistor T5 illustrated in FIG. 1B can be respectively denoted as G2-G5.

For example, as illustrated in FIG. 11B, in the first monitoring stage M1, all the control terminals of the second transistor T2 to the fifth transistor T5 each receive a signal with a high voltage level, the first signal line DATA1 outputs, for example, a signal with a high voltage level, the first capacitor C1 and the second capacitor C2 are charged such that the voltage of the second node 152 is increased, and therefore, the control terminal of the first transistor T1 also receives a signal with a high voltage level. Furthermore, the first monitoring line SENSE1, for example, is in a suspension state, and the first power source terminal OVDD is in a high voltage level state. Therefore, in the first monitoring stage M1, the first transistor T1 to the fifth transistor T5 are in a turn-on value, the circuit diagram illustrated in FIG. 11B can be equivalent to the circuit diagrams illustrated in FIG. 2B and FIG. 2C, that is, the capacitor control circuit connects the first capacitor and the second capacitor in parallel, and allows the first sensing circuit to monitor the first driving circuit. Furthermore, the first organic light emitting element can also be monitored in the first monitoring stage M1, the concrete driving timing diagram can be obtained based on the embodiments of the pixel circuit and FIG. 11B, and no further descriptions will be given here.

For example, as illustrated in FIG. 11B, in the light-emitting stage EL, for example, the control terminals G2-G3 of the second transistor T2 to the third transistor T3 each receive a signal with a high voltage level, the control terminals G4-G5 of the fourth transistor T4 to the fifth transistor T5 each receive a signal with a low voltage level, the first signal line DATA1, for example, outputs a signal with a high voltage level, and the first capacitor C1 is charged such that the voltage of the second node 152 is increased; therefore, the control terminal of the first transistor T1 also receives a signal with a high voltage level. Furthermore, the first monitoring line SENSE1 is, for example, in a low voltage level state, and the first power source terminal OVDD is in a high voltage level state. Therefore, in the light-emitting stage EL, the first transistor T1 to the third transistor T3 are turned on, the fourth transistor T4 to the fifth transistor T5 are turned off, the circuit diagram illustrated in FIG. 1B can be equivalent to the circuit diagram illustrated in FIG. 2A, that is, the capacitor control circuit disconnects the first capacitor from the second capacitor, and allows the driving circuit drive the first organic light emitting element to work normally. For example, details of the driving method of the pixel circuit provided by further another embodiment of present disclosure can refer to the embodiments of the pixel circuit illustrated in FIG. 1 and FIG. 2, and no further descriptions will be given here.

For example, FIG. 12A is a schematic flow chart of another driving method of a pixel circuit provided by further another embodiment of present disclosure. For example, by taken the pixel circuit illustrated in FIG. 3A and FIG. 3B as an example, as illustrated in FIG. 12A, the driving method of the pixel circuit can comprise the following steps:

Step S210: in a first monitoring stage M1, allowing the capacitor control circuit to connect the first capacitor and the second capacitor in parallel, and allowing the first sensing circuit to monitor the first driving circuit or the first organic light emitting element;

Step S220: in a second monitoring stage M2, allowing the capacitor control circuit to connect the first capacitor and the second capacitor in parallel, and allowing the first sensing circuit to monitor the second driving circuit or the second organic light emitting element;

Step S230: in a light-emitting stage EL, allowing the capacitor control circuit to disconnect the first capacitor from the second capacitor, and allowing the driving circuit to drive the first organic light emitting element and/or the second organic light emitting element to work.

For example, FIG. 12B is a schematic timing diagram of the driving method illustrated in FIG. 12A. For example, the control terminals of the second transistor T2 to the fifth transistor T5, and the seventh transistor T7, which are illustrated in FIG. 3B, can be respectively denoted as G2-G5 and G7.

For example, as illustrated in FIG. 12B, in the first monitoring stage M1, the control terminals G2-G5 of the second transistor T2 to the fifth transistor T5 receive signals with high voltage levels, and the control terminal G7 of the seventh transistor T7 receives a signal with a low voltage level, the first signal line DATA1 outputs a signal with a high voltage level, the second signal line DATA2 outputs a signal with a low voltage level, both the first capacitor C and the second capacitor C2 are charged, such that the voltage of the second node 152 is increased, therefore, the control terminal of the first transistor T1 receives a signal with a high voltage level. Furthermore, the first terminal of the sixth transistor T6 is disconnected from the first power source terminal OVDD. For example, the first monitoring line SENSE1 is in a suspension state, the first power source terminal OVDD is in a high voltage level state. Therefore, in the first monitoring stage M1, the first transistor T1 to the fifth transistor T5 are turned on and the seventh transistor T7 is turned off; although the sixth transistor T6 is in turned on, the monitoring operations are not affected because the first terminal of the sixth transistor T6 is disconnected from the first power source terminal OVDD; the circuit diagram illustrated in FIG. 3B can be equivalent to the circuit diagrams illustrated in FIG. 4B-FIG. 4D, that is, the capacitor control circuit connects the first capacitor and the second capacitor in parallel, and allows the first sensing circuit to monitor the first driving circuit. Furthermore, the first organic light emitting element can also be monitored in the first monitoring stage M1, the concrete driving timing diagram can be obtained based on the embodiments of the pixel circuit and FIG. 12B, and no further descriptions will be given here.

For example, as illustrated in FIG. 12B, in the second monitoring stage M2, the control terminals G3-G5 and G7 of the third transistor T3 to the fifth transistor T5 and the seventh transistor T7 receive signals with high voltage levels, and the control terminal G2 of the second transistor T2 receives a signal with a low voltage level, the first signal line DATA outputs a signal with a low voltage level, the second signal line DATA2 outputs a signal with a high voltage level, both the first capacitor C1 and the second capacitor C2 are charged, and the voltage of the fourth node 154 is increased; therefore, the control terminals of the first transistor T1 and the sixth transistor T6 each receive a signal with a high voltage level. Furthermore, the first terminal of the first transistor T1 is disconnected from the first power source terminal OVDD. The first monitoring line SENSE1 is in a suspension state, and the first power source terminal OVDD is in a high voltage level state. Therefore, in the second monitoring stage M2, the third transistor T3 to the seventh transistor T7 are turned on, and the second transistor T2 is turned off; although the first transistor T1 is turned on, the monitoring operations are not affected because the first terminal of the first transistor T1 is disconnected from the first power source terminal OVDD; the circuit diagram illustrated in FIG. 3B can be equivalent to the circuit diagrams illustrated in FIG. 5A-FIG. 5C, that is, the capacitor control circuit can connect the first capacitor and the second capacitor in parallel, and allows the first sensing circuit to monitor the second driving circuit. Furthermore, the second organic light emitting element can also be monitored in the second monitoring stage M2, the concrete driving timing diagram can be obtained based on the embodiments of the pixel circuit and FIG. 12B, and no further descriptions will be given here.

For example, as illustrated in FIG. 12B, in the light-emitting stage, the control terminals G2-G3 and G7 of the second transistor T2 to the third transistor T3 and the seventh transistor T7 each receive a signal with a high voltage level, and the control terminals G4-G5 of the fourth transistor T4 and the fifth transistor T5 each receive a signal with a low voltage level, the first signal line DATA1 and the second signal line DATA2, for example, output a signal with a high voltage level, and the first capacitor C and the second capacitor C2 are charged respectively and independently; therefore, the voltages of the second node 152 and the fourth node 154 are increased according to the data voltages over the data lines DATA and DATA2, and thus the control terminals of the first transistor T1 and the sixth transistor T6 each receive a signal with a high voltage level. Furthermore, the first monitoring line SENSE1 is in a low voltage level state, and the first power source terminal OVDD is in a high voltage level state. Therefore, in the light-emitting stage EL, the first transistor T1 to the third transistor T3 and the sixth transistor T6 to the seventh transistor T7 are turned on, and the fourth transistor T4 and the fifth transistor T5 are turned off, the circuit diagram illustrated in FIG. 3B can be equivalent to the circuit diagram illustrated in FIG. 4A, that is, the capacitor control circuit disconnects the first capacitor from the second capacitor, and allows the driving circuit drive the first organic light emitting element and the second organic light emitting element to work. For example, details of another driving method of the pixel circuit provided by further another embodiment of present disclosure can refer to the embodiments of the pixel circuit illustrated in FIG. 3-FIG. 5, and no further descriptions will be given here.

Figure 13A:
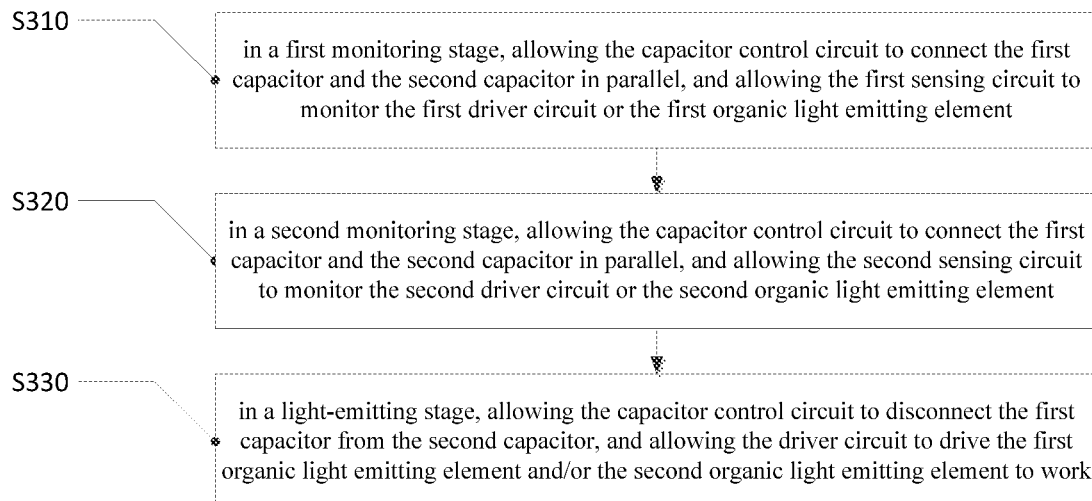
FIG. 13A is a schematic flow chart of further another driving method of a pixel circuit provided by further another embodiment of present disclosure.

For example, FIG. 13A is a schematic flow chart of further another driving method of a pixel circuit provided by further another embodiment of present disclosure. For example, by taken the pixel circuit illustrated in FIG. 7A and FIG. 7B as an example, as illustrated in FIG. 13A, the driving method of the pixel circuit can comprise the following steps:

Step S310: in a first monitoring stage M1, allowing the capacitor control circuit to connect the first capacitor and the second capacitor in parallel, and allowing the first sensing circuit to monitor the first driving circuit or the first organic light emitting element.

Step S320: in a second monitoring stage M2, allowing the capacitor control circuit to connect the first capacitor and the second capacitor in parallel, and allowing the second sensing circuit to monitor the second driving circuit or the second organic light emitting element;

Step S330: in a light-emitting stage EL, allowing the capacitor control circuit to disconnect the first capacitor from the second capacitor, and allowing the driving circuit to drive the first organic light emitting element and/or the second organic light emitting element to work.

Figure 13B:
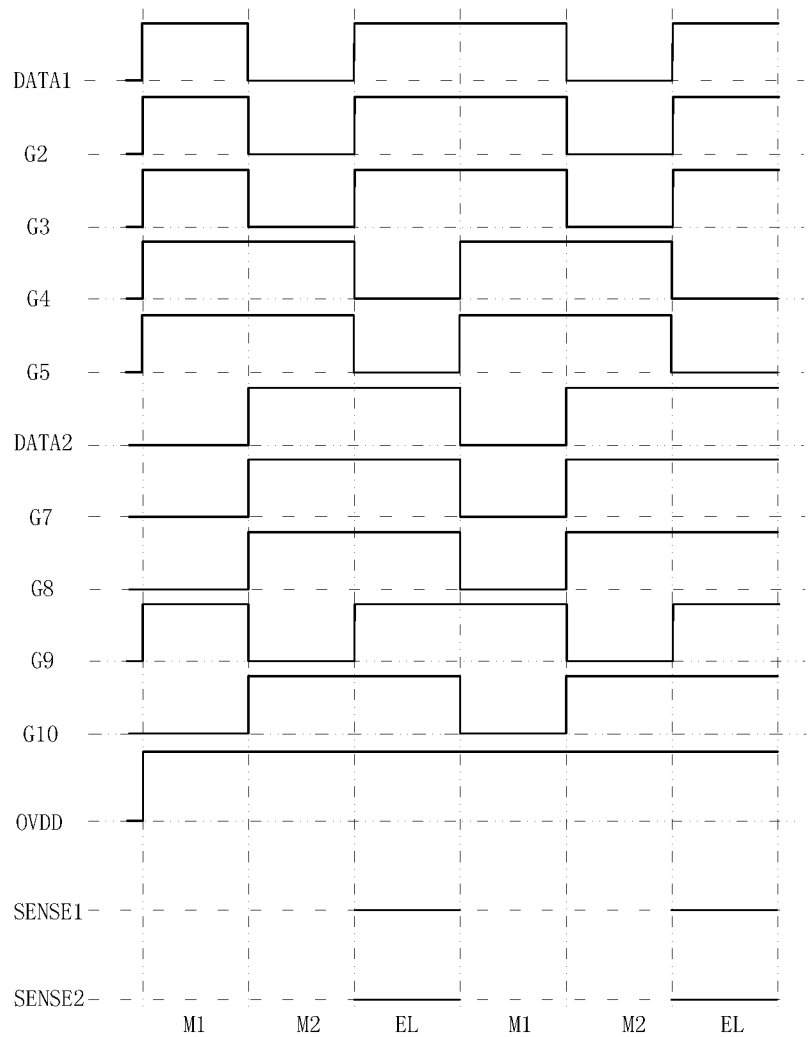
FIG. 13B is a schematic timing diagram of the driving method as illustrated in FIG. 13A.

For example, FIG. 13B is a schematic timing diagram of the driving method illustrated in FIG. 13A. For example, the control terminals of the second transistor T2 to the fifth transistor T5 and the seventh transistor T7 to the tenth transistor T10 illustrated in FIG. 7B can be respectively denoted as G2-G5 and G7-G10.

For example, as illustrated in FIG. 13B, in the first monitoring stage M1, the control terminals G2-G5 and G9 of the second transistor T2 to the fifth transistor T5, and the ninth transistor T9 each receive a signal with a high voltage level, and the control terminals G7-G8 and G10 of the seventh transistor T7 to the eighth transistor T8, and the tenth transistor T10 each receive a signal with a low voltage level, the first signal line DATA1 outputs a signal with a high voltage level, the second signal line DATA2 outputs a signal with a low voltage level, both the first capacitor C and the second capacitor C2 are charged and the voltage of the second node 152 is increased, and therefore the control terminals of the first transistor T1 and the sixth transistor T6 receive each a signal with a high voltage level. Furthermore, the first terminal of the sixth transistor T6 is disconnected from the first power source terminal OVDD, the first monitoring line SENSE1 is in a suspension state, and the first power source terminal OVDD is in a high voltage level state. Therefore, in the first monitoring stage M1, the first transistor T1 to the fifth transistor T5 and the ninth transistor T9 are turned on, and the seventh transistor T7, the eighth transistor T8 and the tenth transistor T10 are turned off; although the sixth transistor T6 is turned on, the monitoring operations are not affected because the first terminal of the sixth transistor T6 is disconnected from the first power source terminal OVDD; the circuit diagram illustrated in FIG. 7B can be equivalent to the circuit diagrams illustrated in FIG. 8B-FIG. 8D, that is, the capacitor control circuit connects the first capacitor and the second capacitor in parallel, and allows the first sensing circuit to monitor the first driving circuit. Furthermore, in the first monitoring stage M1, the first organic light emitting element can also be monitored, the concrete driving timing diagram can be obtained based on the embodiments for the pixel circuit and FIG. 13B, and no further descriptions will be given here.

For example, as illustrated in FIG. 13B, in the second monitoring stage M2, the control terminals G4-G5, G7-G8 and G10 of the fourth transistor T4 to the fifth transistor T5, the seventh transistor T7 to the eighth transistor T8, and the tenth transistor T10 each receive a signal with a high voltage level, and the control terminals G2-G3 and G9 of the second transistor T2 to the third transistor T3, and the ninth transistor T9 each receive a signal with a low voltage level, the first signal line DATA1 outputs a signal with a low voltage level, the second signal line DATA2 outputs a signal with a high voltage level, both the first capacitor C1 and the second capacitor C2 are charged, and the voltage of the fourth node 154 is increased, therefore the control terminals of the first transistor T1 and the sixth transistor T6 each receive a signal with a high voltage level. Furthermore, the first terminal of the first transistor T1 is disconnected from the first power source terminal OVDD, the first monitoring line SENSE1 is in a suspension state, and the first power source terminal OVDD outputs a signal with a high voltage level. Therefore, in the second monitoring stage M2, the fourth transistor T4 to the eighth transistor T8, and the tenth transistor T10 are turned on, the third transistor T3 and the ninth transistor T9 are turned off; although the first transistor T1 is turned on, the monitoring operations are not affected because the first terminal of the first transistor T1 is disconnected from the first power source terminal OVDD; the circuit diagram illustrated in FIG. 7B can be equivalent to the circuit diagram illustrated in FIG. 9A-9C, that is, the capacitor control circuit connects the first capacitor and the second capacitor in parallel, and allows the second sensing circuit to monitor the second driving circuit. Furthermore, the second organic light emitting element also can be monitored in the second monitoring stage M2, the concrete driving timing diagram can be obtained based on the embodiments for the pixel circuit and FIG. 13B, and no further descriptions will be given herein.

For example, as illustrated in FIG. 13B, in the light-emitting stage EL, the control terminals G2-G3 and G7-G10 of the second transistor T2 to the third transistor T3, and the seventh transistor T7 to the tenth transistor T10 each receive a signal with a high voltage level, and the control terminals G4-G5 of the fourth transistor T4 and the fifth transistor T5 each receive a signal with a low voltage level, the first signal line DATA1 and the second signal line DATA2 output a signal with a high voltage level, the first capacitor C1 and the second capacitor C2 are charged respectively and independently, and the voltages of the second node 152 and the fourth node 154 are increased according to the data voltages over the data lines DATA1 and DATA2; therefore, the control terminals of the first transistor T1 and the sixth transistor T6 also each receive a signal with a high voltage level. Furthermore, the first monitoring line SENSE1 is in a low voltage level state, the first power source terminal OVDD is in a high voltage level state. Therefore, in the light-emitting stage EL, the first transistor T1 to the third transistor T3, and the sixth transistor T6 to the tenth transistor T10 are turned on, the fourth transistor T4 and the fifth transistor T5 are turned off, the circuit diagram illustrated in FIG. 7B can be equivalent to the circuit diagram illustrated in FIG. 8A, that is, the capacitor control circuit can disconnect the first capacitor from the second capacitor, and allows the driving circuit drive the first organic light emitting element and the second organic light emitting element to work. It is shown in the above-mentioned descriptions that the first organic light emitting element and the second organic light emitting element operates independently, and therefore, whether they are to be turned on or not and their luminous brightness can be respectively and independently controlled by the first data line DATA1 and the second data line DATA2. For example, details of further another driving method of the pixel circuit provided by further another embodiment of present disclosure can refer to the embodiments for the pixel circuit illustrated in FIG. 7-FIG. 9, and no further descriptions will be given here.

For example, FIG. 11B, FIG. 12B and FIG. 13 are timing diagram respectively for the driving method as illustrated in the FIG. 11A, FIG. 12A and FIG. 13A in an exemplary manner. For example, in the case that FIG. 13B illustrates a high voltage level, the entire time period of the first monitoring stage M1, the second monitoring stage M2 or the display stage EL is shown with the high voltage level; however, the embodiment of present disclosure are not limited to this case, for example, for the second transistor T2 to the third transistor T3 and the seventh transistor T7 to the eighth transistor T8, in a case that a signal with a high voltage level is inputted, the signal with the high voltage level can be inputted during part of the time period of a stage (for example, for the light-emitting stage, the signal with the high voltage level can be inputted during the signal writing period at the beginning of the light-emitting stage), while a signal with a low voltage level can be inputted in the remaining time of the time period of the stage, such that the power consumption for driving the pixel circuit can be reduced.

For example, for the sake of clarity, the timing diagram of the driving method provided by an embodiment of present disclosure only illustrate the first monitoring stage and/or the second monitoring stage, and the light-emitting stage, those skilled in the art should understand that the driving method can include other working stages for the pixel circuit, no further descriptions will be given herein and it should not be construed as a limitation on the embodiments of the present disclosure.

The driving method of the pixel circuit provided by further another embodiment of present disclosure can accelerate the charging speed in the sensing stage, and increase the accuracy of the sensed value, and thus the compensation effect can be improved.

Although detailed description has been given above to the present disclosure with general description and embodiments, it shall be apparent to those skilled in the art that some modifications or improvements may be made on the basis of the embodiments of the present disclosure. Therefore, all the modifications or improvements made without departing from the spirit of the present disclosure shall all fall within the scope of protection of the present disclosure.

What are described above is related to the illustrative embodiments of the disclosure only and not limitative to the scope of the disclosure; the scopes of the disclosure are defined by the accompanying claims.

The application claims priority to Chinese patent application No. 201710333212.5, filed on May 12, 2017, the entire disclosure of which is incorporated herein by reference as part of the present application.

What is claimed is:

1. A pixel circuit, comprising: a first selection circuit, a first driving circuit, a first capacitor, a first sensing circuit, a first organic light emitting element, a second capacitor and a capacitor control circuit, wherein
the first selection circuit and the first capacitor are electrically connected with each other, and are configured to control the first driving circuit;
the first driving circuit is electrically connected to the first organic light emitting element, and is configured to drive the first organic light emitting element;
the first sensing circuit is electrically connected to the first driving circuit and the first organic light emitting element and is configured to sense the first driving circuit or the first organic light emitting element; and
the capacitor control circuit is configured to allow the first capacitor and the second capacitor to be connected in parallel or to be disconnected.

2. The pixel circuit according to claim 1, wherein the first capacitor is electrically connected to the first sensing circuit.

3. The pixel circuit according to claim 1, further comprising: a second selection circuit, a second driving circuit, a second organic light emitting element, and a second sensing circuit, wherein
the second selection circuit and the second capacitor are configured to control the second driving circuit;
the second driving circuit is electrically connected to the second organic light emitting element and is configured to drive the second organic light emitting element; and
the second sensing circuit is electrically connected to the second driving circuit and the second organic light emitting element, and is configured to sense the second driving circuit or the second organic light emitting element.

4. The pixel circuit according to claim 3, further comprising a first control circuit and a second control circuit, wherein
the first control circuit is configured to control whether or not the first driving circuit electrically connected to a first power source terminal, and the second control circuit is configured to control whether or not the second driving circuit is electrically connected to the first power source terminal.

5. A display panel, comprising the pixel circuit according to claim 1.

6. A driving method for the pixel circuit according to claim 1, comprising:
in a first monitoring stage, allowing the capacitor control circuit to connect the first capacitor and the second capacitor in parallel, and allowing the first sensing circuit to monitor the first driving circuit or the first organic light emitting element.

7. The driving method according to claim 6, further comprising:
in a light-emitting stage, allowing the capacitor control circuit to disconnect the first capacitor from the second capacitor, and allowing the first driving circuit to drive the first organic light emitting element to work.

8. The driving method according to claim 6, the pixel circuit further comprising a second selection circuit, a second driving circuit and a second organic light emitting element, the second selection circuit and the second capacitor being configured to control the second driving circuit, the second driving circuit being electrically connected to the second organic light emitting element and being configured to drive the second organic light emitting element,
the driving method further comprising:
in a second monitoring stage, allowing the capacitor control circuit to connect the first capacitor and the second capacitor in parallel, and allowing the first sensing circuit to monitor the second driving circuit or the second organic light emitting element.

9. The pixel circuit according to claim 1, wherein the first driving circuit comprises a first transistor;
the capacitor control circuit comprises a fourth transistor and a fifth transistor;
a first terminal of the fourth transistor is electrically connected to a second terminal of the first capacitor and a control terminal of the first transistor, and a second terminal of the fourth transistor of is electrically connected to a first terminal of the second capacitor;

a first terminal of the fifth transistor is electrically connected to a first terminal of the first capacitor and a second terminal of the first transistor, and a second terminal of the fifth transistor is electrically connected to a second terminal of the second capacitor.

10. A pixel circuit, comprising: a first selection circuit, a first driving circuit, a first capacitor, a first sensing circuit, a first organic light emitting element, a second capacitor, a capacitor control circuit, a second selection circuit, a second driving circuit, a second organic light emitting element, a second sensing circuit, a first control circuit and a second control circuit, wherein the first selection circuit and the first capacitor are electrically connected with each other, and are configured to control the first driving circuit;

the first driving circuit is electrically connected to the first organic light emitting element, and is configured to drive the first organic light emitting element;

the first sensing circuit is electrically connected to the first driving circuit and the first organic light emitting element and is configured to sense the first driving circuit or the first organic light emitting element;

the capacitor control circuit is configured to allow the first capacitor and the second capacitor to be connected in parallel or to be disconnected;

the second selection circuit and the second capacitor are configured to control the second driving circuit;

the second driving circuit is electrically connected to the second organic light emitting element and is configured to drive the second organic light emitting element;

the second sensing circuit is electrically connected to the second driving circuit and the second organic light emitting element, and is configured to sense the second driving circuit or the second organic light emitting element;

the first control circuit is configured to control whether or not the first driving circuit is electrically connected to a first power source terminal, and the second control circuit is configured to control whether or not the second driving circuit is electrically connected to the first power source terminal;

the pixel circuit further comprises a first node and a second node;

the first driving circuit comprises a first transistor;

the first selection circuit comprises a second transistor;

the first sensing circuit comprises a third transistor;

the capacitor control circuit comprises a fourth transistor;

a first terminal of the first transistor is configured to be electrically connected to the first power source terminal, the second terminal of the first transistor is electrically connected to the first node, and the control terminal of the first transistor is electrically connected to the second node;

a first terminal of the second transistor is configured to be electrically connected to a first data line, and a second terminal of the second transistor is electrically connected to the second node;

a first terminal of the third transistor is electrically connected to the first node, and a second terminal of the third transistor is configured to be electrically connected to a first monitoring line;

a first terminal of the fourth transistor is electrically connected to the second node, and a second terminal of the fourth transistor of is electrically connected to a first terminal of the second capacitor;

a second terminal of the second capacitor is electrically connected to the first node;

a first terminal of the first capacitor is electrically connected to the first node, and a second terminal of the first capacitor is electrically connected to the second node; and a first terminal of the first organic light emitting element is electrically connected to the first node, and a second terminal of the first organic light emitting element is configured to be electrically connected to a second power source terminal.

11. The pixel circuit according to claim 10, further comprising a third node and a fourth node, wherein the second driving circuit comprises a sixth transistor;

the second selection circuit comprises a seventh transistor;

a first terminal of the sixth transistor is configured to be electrically connected to the first power source terminal, a second terminal of the sixth transistor is electrically connected to the third node, and a control terminal of the sixth transistor is electrically connected to the fourth node;

a first terminal of the seventh transistor is configured to be electrically connected to a second data line, and a second terminal of the seventh transistor is electrically connected to the fourth node;

the first terminal of the second capacitor is electrically connected to the fourth node, and the second terminal of the second capacitor is electrically connected to the third node; and a first terminal of the second organic light emitting element is electrically connected to the third node, and a second terminal of the second organic light emitting element is configured to be electrically connected to the second power source terminal.

12. The pixel circuit according to claim 11, wherein the second sensing circuit comprises an eighth transistor, a first terminal of the eighth transistor is electrically connected to the third node, and a second terminal of the eighth transistor is configured to be electrically connected to a second monitoring line.

13. The pixel circuit according to claim 12, wherein the first control circuit comprises a ninth transistor;

the second control circuit comprises a tenth transistor;

a first terminal of the ninth transistor is electrically connected to the first terminal of the first transistor, and a second terminal of the ninth transistor is configured to be electrically connected to the first power source terminal; and a first terminal of the tenth transistor is electrically connected to the first terminal of the sixth transistor, and a second terminal of the tenth transistor is configured to be electrically connected to the first power source terminal.

14. A pixel circuit, comprising: a first selection circuit, a first driving circuit, a first capacitor, a first sensing circuit, a first organic light emitting element, a second capacitor, a capacitor control circuit, a second selection circuit, a second driving circuit, a second organic light emitting element, a second sensing circuit, a first control circuit and a second control circuit;

wherein the first selection circuit and the first capacitor are electrically connected with each other, and are configured to control the first driving circuit;

the first driving circuit is electrically connected to the first organic light emitting element, and is configured to drive the first organic light emitting element;

the first sensing circuit is electrically connected to the first driving circuit and the first organic light emitting element and is configured to sense the first driving circuit or the first organic light emitting element;

the capacitor control circuit is configured to allow the first capacitor and the second capacitor to be connected in parallel or to be disconnected;

the second selection circuit and the second capacitor are configured to control the second diving circuit;

the second driving circuit is electrically connected to the second organic light emitting element and is configured to drive the second organic light emitting element;

the second sensing circuit is electrically connected to the second driving circuit and the second organic light emitting element, and is configured to sense the second driving circuit or the second organic light emitting element;

the first control circuit is configured to control whether or not the first driving circuit is electrically connected to a first power source terminal, and the second control circuit is configured to control whether or not the second driving circuit is electrically connected to the first power source terminal;

the pixel circuit further comprises a first node and a second node;

the first driving circuit comprises a first transistor;

the first selection circuit comprises a second transistor;

the first sensing circuit comprises a third transistor;

the capacitor control circuit comprises a fourth transistor and a fifth transistor;

a first terminal of the first transistor is configured to be electrically connected to the first power source terminal, the second terminal of the first transistor is electrically connected to the first node, and the control terminal of the first transistor is electrically connected to the second node;

a first terminal of the second transistor is configured to be electrically connected to a first data line, and a second terminal of the second transistor is electrically connected to the second node;

a first terminal of the third transistor is electrically connected to the first node, and a second terminal of the third transistor is configured to be electrically connected to a first monitoring line;

a first terminal of the fourth transistor is electrically connected to the second node, and a second terminal of the fourth transistor of is electrically connected to a first terminal of the second capacitor;

a first terminal of the fifth transistor is electrically connected to the first node, and a second terminal of the fifth transistor is electrically connected to a second terminal of the second capacitor;

a first terminal of the first capacitor is electrically connected to the first node, and a second terminal of the first capacitor is electrically connected to the second node; and a first terminal of the first organic light emitting element is electrically connected to the first node, and a second terminal of the first organic light emitting element is configured to be electrically connected to a second power source terminal.

15. The pixel circuit according to claim 14, wherein a control terminal of the fourth transistor and a control terminal of the fifth transistor are configured to be electrically connected to same one signal line;

the second power source terminal is a GND terminal; and light emitted by the first organic light element and light emitted by the second organic light emitting element are different in color.

16. The pixel circuit according to claim 14, further comprising a third node and a fourth node, wherein the second driving circuit comprises a sixth transistor;

the second selection circuit comprises a seventh transistor;

a first terminal of the sixth transistor is configured to be electrically connected to the first power source terminal, a second terminal of the sixth transistor is electrically connected to the third node, and a control terminal of the sixth transistor is electrically connected to the fourth node;

a first terminal of the seventh transistor is configured to be electrically connected to a second data line, and a second terminal of the seventh transistor is electrically connected to the fourth node;

the first terminal of the second capacitor is electrically connected to the fourth node, and the second terminal of the second capacitor is electrically connected to the third node; and a first terminal of the second organic light emitting element is electrically connected to the third node, and a second terminal of the second organic light emitting element is configured to be electrically connected to the second power source terminal.

17. The pixel circuit according to claim 16, wherein the second sensing circuit comprises an eighth transistor, a first terminal of the eighth transistor is electrically connected to the third node, and a second terminal of the eighth transistor is configured to be electrically connected to a second monitoring line.

18. The pixel circuit according to claim 17, wherein the first control circuit comprises a ninth transistor;

the second control circuit comprises a tenth transistor;

a first terminal of the ninth transistor is electrically connected to the first terminal of the first transistor, and a second terminal of the ninth transistor is configured to be electrically connected to the first power source terminal; and a first terminal of the tenth transistor is electrically connected to the first terminal of the sixth transistor, and a second terminal of the tenth transistor is configured to be electrically connected to the first power source terminal.

19. A display panel, comprising the pixel circuit according to claim 14.

20. A driving method for the pixel circuit according to claim 14, comprising:

in a first monitoring stage, allowing the capacitor control circuit to connect the first capacitor and the second capacitor in parallel, and allowing the first sensing circuit to monitor the first driving circuit or the first organic light emitting element.

* * * * *